United States Patent
Karaki et al.

(10) Patent No.: US 6,429,701 B2
(45) Date of Patent: Aug. 6, 2002

(54) DRIVE CIRCUIT FOR SEMICONDUCTOR POWER DEVICE AND SEMICONDUCTOR SWITCHING CIRCUIT USING THE DRIVE CIRCUIT

(75) Inventors: Toshiro Karaki; Kraisorn Throngnumchai, both of Kanagawa-ken (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 09/745,735

(22) Filed: Dec. 26, 2000

(30) Foreign Application Priority Data

Dec. 28, 1999 (JP) ............................. 11-373485
Sep. 8, 2000 (JP) ........................ 2000-273761

(51) Int. Cl.$^7$ ................................................ H03K 3/00
(52) U.S. Cl. ......................... 327/110; 327/377; 327/379
(58) Field of Search ................. 327/108–112, 374–379, 327/383, 384, 389, 427, 431, 434, 435, 440

(56) References Cited

U.S. PATENT DOCUMENTS

| | | | | |
|---|---|---|---|---|
| 5,555,872 A | * | 9/1996 | Takeuchi et al. ............. | 123/497 |
| 5,563,759 A | * | 10/1996 | Nadd ........................... | 361/101 |
| 5,710,508 A | * | 1/1998 | Watanabe ..................... | 323/284 |
| 5,742,193 A | | 4/1998 | Colli et al. ................... | 327/170 |
| 5,844,760 A | * | 12/1998 | Kumagai et al. ............. | 361/58 |
| 6,194,951 B1 | | 2/2001 | Allmeier ...................... | 327/424 |
| 6,205,010 B1 | * | 3/2001 | Ohsaka et al. ............... | 361/103 |

FOREIGN PATENT DOCUMENTS

| | | |
|---|---|---|
| DE | 196 34 612 | 3/1998 |
| DE | 197 17 715 | 10/1998 |
| DE | 197 40 697 | 2/1999 |
| EP | 0 620 644 | 10/1994 |
| EP | 0 814 564 | 12/1997 |
| EP | 0 817 381 | 1/1998 |
| JP | 6-252408 | 9/1994 |

OTHER PUBLICATIONS

B. Weis et al., "A New Gate Driver Circuit For Improved Turn–Off Characteristics of High Current IGBT Modules", IEEE 1998, pp. 1073–1077.

* cited by examiner

Primary Examiner—My-Trang Nu Ton
(74) Attorney, Agent, or Firm—Foley & Lardner

(57) ABSTRACT

In the initial stage of the operation of turning off a semiconductor device, the impedance of a carrier pull out circuit remains low for rapidly pulling out the stored carriers from the control electrode of the device. When the turn-off transition of the device proceeds and becomes close to its completion, the impedance of the carrier pull out circuit is shifted to a higher level for retarding the carrier pull out speed. A detector is provided for detecting a control current developed by pulling out the carriers. When the current measured by the detector drops down to below a predetermined level, it is judged that the turn-off transition is approaching to its end. This permits the turn-off transition to be smoothly finished and can thus prevent unwanted oscillation of the control electrode voltage. More specifically, the device can be inhibited from being accidentally turned on by the effect of oscillation of the control electrode voltage and also, the decay time in the turn off transition becomes longer while the storage time is same as the conventional circuitry.

21 Claims, 13 Drawing Sheets

| J | K | f |
|---|---|---|
| L | L | fp |
| L | H | L |
| H | L | H |
| H | H | $\overline{fp}$ |

| S | R | f  |
|---|---|----|
| L | L | fp |
| L | H | L  |
| H | L | H  |
| H | H | H  |

DRIVE CIRCUIT FOR SEMICONDUCTOR POWER DEVICE AND SEMICONDUCTOR SWITCHING CIRCUIT USING THE DRIVE CIRCUIT

BACKGROUND OF THE INVENTION

1. Field of the Invention

The present invention pertains to a drive circuit for a semiconductor device and a semiconductor switching circuit using the drive circuit. Especially, the present invention pertains to a drive circuit for a semiconductor power device, which is turned on and off through controlling the current applied to its control electrode.

2. Description of the Related Art

A transistor disclosed in Japanese Published Unexamined Patent Application H6-252408 is known as "a current-controlled semiconductor element" suitable for driving an inductive load. The transistor is supplied at its control electrode with a control current for turning on and off the transistor while its drain electrode is connected to the inductive load. The control electrode current is received from a CMOS inverter, which has a pMOS transistor and an nMOS transistor connected in series with each other. The CMOS inverter is thus connected between the controlled current source and the source electrode of the transistor. The control current is connected with a connecting point between the pMOS transistor and nMOS transistor. When the voltage Vm supplied to the input terminal of the CMOS inverter or the control electrodes of both the p-type and nMOS transistors is shifted from high level to low level, the pMOS transistor is turned on and the nMOS transistor is turned off. Accordingly, the carriers are injected into the control electrode, hence turning on the transistor to pass the current from the source to the inductive load. As the load connected to the transistor is of an inductive type, the drain current $I_{ds}$ is gradually increased. When the signal Vm at the driver signal input terminal turns to the high level, the pMOS transistor is turned off and the nMOS transistor is turned on. Accordingly, the current to the control electrode of the transistor is then disconnected. As the carriers are pulled out via the nMOS transistor from the control electrode of the transistor, they turn off the transistor.

SUMMARY OF THE INVENTION

However, the path along which the control current flows has, in addition to parasitic inductance, a level of resistance including the ON resistance of the nMOS transistor and the resistance of wire itself and a size of parasitic capacitance. The transistor is commonly a current driven device and thus draws a large amount of control current while it is turned off within a short period of time. It is hence necessary in the operation of turning off the release the energy accumulated in the parasitic inductance at once. This will result in RLC resonance between the energy and the parasitic components, thus oscillating the control electrode voltage $V_{gs}$. As the control electrode voltage is increased to an ON voltage level by the oscillation, it unfavorably turns the transistor on thus passing the drain current $I_{ds}$. When the resistance of the carrier pull out circuit is increased for preventing the rapid pulling of control current, the oscillation of the control electrode voltage may be diminished more or less. However, the storage period from the release of a turn off command to the actual turning off of the transistor increases.

It is an object of the present invention to provide a drive circuit for a semiconductor device and a semiconductor switching circuit using the drive circuit, which minimize the oscillation of the control signal for turning off the semiconductor device.

Another object of the present invention is to provide a drive circuit and a semiconductor switching circuit using the drive circuit, by which high-speed turn off transition of the semiconductor device is carried out, sweeping out storage carries effectively and quickly in the semiconductor device, and its erroneous operation due to the unexpected oscillation of the control electrode voltage is successfully be prevented.

Still another object of the present invention is to provide a drive circuit and a semiconductor switching circuit using the drive circuit, in which a specific feature representing a turn-off transition of the semiconductor device is close to its completion is measured at higher accuracy.

Still another object of the present invention is to provide a drive circuit and a semiconductor switching circuit using the drive circuit, in which the response speed to the specific feature representing the turn-off transition of the semiconductor device is close to its completion is high.

Still another object of the present invention is to provide a drive circuit and a semiconductor switching circuit using the drive circuit, in which the resistance component which serves as a damping factor in the RLC resonance is increased so as to effectively attenuate the oscillation of the control electrode voltage, thus inhibiting the semiconductor device from being accidentally turned off.

Still another object of the present invention is to provide a drive circuit and a semiconductor switching circuit using the drive circuit, which can suppress the generation of voltage surges throughout the circuit, and improve the noise immunity.

Still another object of the present invention is to provide a drive circuit and a semiconductor switching circuit using the drive circuit, in which the switching element constituting the drive circuit is inhibited from being turned on by the impulses noise so as to protect the erroneous operation of the semiconductor device.

Still another object of the present invention is to provide a drive circuit and a semiconductor switching circuit using the drive circuit, in which an excessive large flow of unrequired current in the drive circuit due to the impulse noise can be effectively suppressed so as to protect the erroneous operation of the semiconductor device.

For achievement of the above objects of the present invention, a first feature of the present invention, pertaining to a drive circuit for a semiconductor device having a control electrode, first and second main electrodes, inheres in the circuit configuration having a detector, a carrier pull out circuit and a control circuit. The detector detects a specific feature representing a turn-off transition of the semiconductor device is approaching to its completion. The carrier pull out circuit pulls out stored carriers from the control electrode. The control circuit maintains the impedance of the carrier pull out circuit at a first level in the initial stage of the turn-off transition and, when the detector detects the specific feature, changes the impedance of the carrier pull out circuit to a second level higher than the first level.

A second feature of the present invention, pertaining to a semiconductor switching circuit, inheres in the circuit configuration having a semiconductor device, which has a control electrode, first and second main electrodes, a detector, a carrier pull out circuit and a control circuit. The detector detects a specific feature representing a turn-off transition of the semiconductor device is approaching to its completion. The carrier pull out circuit pulls out stored carriers from the control electrode. The control circuit maintains the impedance of the carrier pull out circuit at a first level in the initial stage of the turn-off transition and, when the detector detects the specific feature, changes the impedance of the carrier pull out circuit to a second level higher than the first level.

A third feature of the present invention, pertaining to a drive circuit for a semiconductor device having a control electrode, a first and second main electrodes, inheres in the circuit configuration having a detecting means. The detecting means is provided for detecting a specific feature representing a turn-off transition of the semiconductor device is approaching to its completion. The carrier pull out means is provided for pulling out stored carriers from the control electrode. The control means is provided for maintaining the impedance of the carrier pull out means at a first level in the initial stage of the turn-off transition and, when the detecting means detects the specific feature. And the control means is provided for changing the impedance of the carrier pull out means to a second level higher than the first level.

A fourth feature of the present invention, pertaining to a semiconductor switching circuit, inheres in the circuit configuration having a semiconductor device, which has a control electrode, first and second main electrodes, a detecting means, a carrier pull out means. The detecting means is provided for detecting a specific feature representing a turn-off transition of the semiconductor device is approaching to its completion. The carrier pull out means is provided for pulling out stored carriers from the control electrode. The control means is provided for maintaining the impedance of the carrier pull out means at a first level in the initial stage of the turn-off transition and, when the detecting means detects the specific feature. And the control means is provided for changing the impedance of the carrier pull out means to a second level higher than the first level.

Other and further objects and features of the present invention will become obvious upon an understanding of the illustrative embodiments about to be described in connection with the accompanying drawings or will be indicated in the appended claims, and various technical advantages not referred to herein will occur to one skilled in the art upon employing of the invention in practice.

DETAILED DESCRIPTION OF THE PREFERRED EMBODIMENTS

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(Structure of Current-Controlled Semiconductor Element)

At first, a current-controlled semiconductor element suitable for a candidate for the semiconductor device at output stage, employed in a semiconductor switching circuit of the present invention, will be explained. Here, it is assumed that the semiconductor is silicon.

Figure 1A:
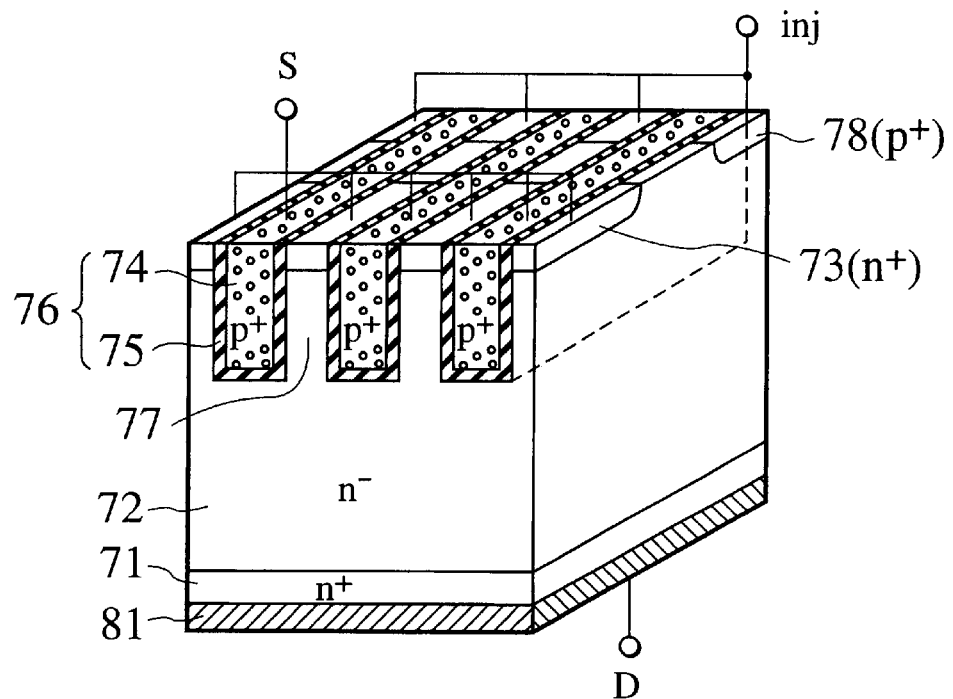
FIG. 1A is a perspective view illustrating a structure of a semiconductor device suitable for present invention.

FIG. 1A is a perspective view explaining a basic structure of the current-controlled semiconductor element suitable for the semiconductor device of the present invention. The device shown in FIG. 1A has an electrode (of a metal layer) eliminated from the surface thereof for ease of illustration. As shown in FIG. 1A, and $n^-$ drain region 72 is provided over an $n^+$ substrate region 71. Provided on the $n^-$ drain region 72 are $n^+$ source regions 73 and $p^+$ injector regions 78. A group of U grooves of which the two sidewalls extend vertically are provided at the top and in the $n^-$ drain region 72, penetrating the $n^+$ source regions 73 from the top to towards the interior of the $n^-$ drain region 72. An insulating film 75 is provided on the bottom and the inner wall of each of the U grooves. Each of the U grooves is filled with an MOS electrode 74 covering the insulating film 75. The MOS electrode 74 is of heavily doped p-type polycrystalline silicon. The insulating film 75 provides electrical insulation between the MOS electrode 74 and the $n^-$ drain region 72. Hence, a combination of the MOS electrode 74 and the insulating film 75 is referred to as a "fixed insulating electrode 76" hereinafter.

Also, a portion of the $n^-$ drain region 72 between any two adjacent fixed insulating electrodes 76 is referred to as a "channel region 77". As separated by the insulating film 75 from the MOS electrode 74 of the heavily doped p-type polycrystalline silicon, the channel region 77 has a potential barrier for conductive electrons developed therein by a depletion layer resulting from the work function difference, thus electrically cutting off between the n⁺ source region 73 and the n⁻ drain region 72. A drain electrode 81 is provided at the bottom of the n⁺ substrate region 71 so as to develop an ohmic contact with the n⁺ substrate region 71.

Figure 1B:
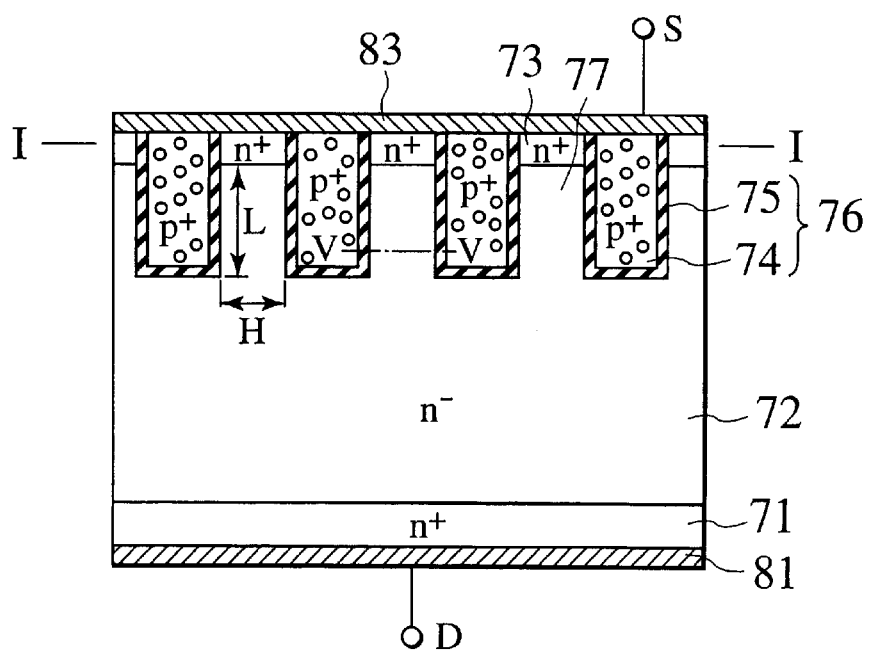
FIG. 1B is a longitudinal cross sectional view of the same shown in FIG. 1A.

FIG. 1B is a cross sectional view taken in parallel with the front side of the device shown in the perspective view of FIG. 1A. In FIG. 1B, a source electrode 83 not shown in FIG. 1A is illustrated forming an ohmic contact with the n⁺ source region 73 and the MOS electrode 74. More specifically, the potential at the MOS electrode 74 is fixed to a potential level at the source electrode 83. As illustrated in FIG. 1B, "H" represents the channel thickness and "L" is the channel length.

Figure 1C:
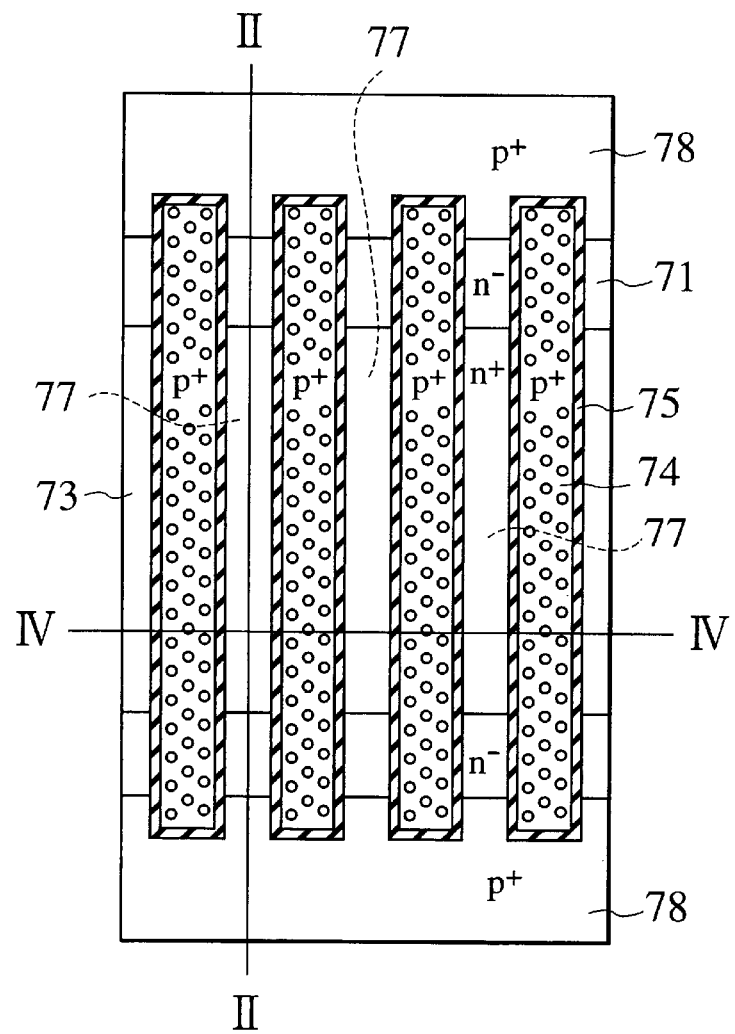
FIG. 1C is a plan view of the same shown in FIG. 1B.

FIG. 1C is a plan view of the current-controlled semiconductor element Q1 showing the surface electrode (of a metal layer) eliminated similar to FIG. 1A. FIG. 1C illustrates a cross section taken along the vertical to the sheet of paper, including the line I—I of FIG. 1B. Accordingly, the cross section of FIG. 1B is taken along the vertical to the sheet including the line IV—IV of FIG. 1C. As shown in FIG. 1C, the fixed insulating electrodes 76 appear in a stripe form and are arranged at both ends in contact with the p⁺ injector regions 78. As apparent, each of the channel regions 77 defined between the fixed insulating electrodes 76 and the p⁺ injector regions 78 is provided as a unit cell. FIG. 1C illustrates four unit cells. Provided that the current can be disconnected or the flow of current can be controlled by the operation of the channels, the fixed insulating electroded 76 defining the unit cells and the n⁺ source regions 73 are not limited in the shape.

Figure 1D:
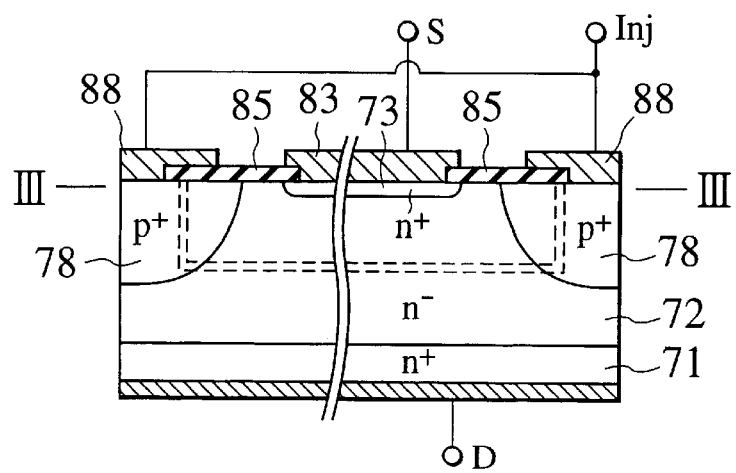
FIG. 1D is a cross sectional view taken along the line B—B of FIG. 1C.

FIG. 1D is a cross sectional view taken along the vertical to the sheet of paper including the line II—II of FIG. 1C. The cross section taken along the line III—III of FIG. 1D is shown in FIG. 1A. As shown in FIG. 1D, the n⁻ drain region 72 is covered at surface with interlayer insulating films 85. Injection electrode 88 are disposed in the openings provided in the interlayer insulating films 85 so that they are in ohmic contact with the p⁺ injector regions 78. Similarly, the source electrodes 83 are in ohmic contact with the n⁺ source regions 73. Minority carriers can be injected from the injection electrode 88 via the p⁺ injector region 78 to the n⁻ drain region 72. The broken lines shown in FIG. 1D represent the hidden fixed insulating electrode 7.

(Operation of Current-Controlled Semiconductor Element)

The operation of the current-controlled semiconductor element Q1, as the semiconductor device Q1, having the foregoing structure will now be described. In the current-controlled semiconductor element Q1, the source electrode 83 is connected to the ground (OV) and the drain electrode 81 is supplied with a positive potential.

a) Blocking State

The blocking state of the current-controlled semiconductor element Q1 is first explained. When the injection electrode 78 of the current-controlled semiconductor element Q1 is connected to the ground, the current-controlled semiconductor element Q1 remains in the blocking state. As explained previously, the MOS electrode 74 of the current-controlled semiconductor element Q1 is made of heavily doped p-type polycrystalline silicon and fixed at its source electrode potential. Hence, since the depletion layer is developed around the fixed insulating electrode 76, the channel region 7 is depleted to electrically cutoff between the n⁺ source region 73 and the n⁻ drain region 72. In common, when such an MOS diode-like arrangement is supplied with a voltage for expanding the depletion layer, the carriers generated in the depletion layer of the drain region stay along the insulating film interface and develop an inverted layer thus causing the depletion layer not to expand and increasing the potential at the insulating film interface. However, the insulating film 75 of that arrangement is in contact with the p⁺ injector region 78, which is grounded. This permits the carriers generated in the depletion layer to quickly move to the interface with the insulating film 75 and then pass through the p⁺ injector region 78 before finally discharged out from the current-controlled semiconductor element Q1. More specifically, while the potential at the insulating film interface is not increased but held unchanged, the depletion layer extends with the drain potential. Accordingly, the device is of normally off type.

b) Transition from Blocking to Conducting State

The process of transition from the blocking state to the conducting state of the current-controlled semiconductor element Q1 is now explained. When the injection electrode potential $V_j$ of the current-controlled semiconductor element Q1 is zero, the potential at the V—V cross section of the channel region 7 shown in FIG. 1B is positive, allowing the channel region 7 to be cutoff state. When the injection electrode potential $V_j$ increases up to 0.3 V, the channel region 7 develops a negative area at its central portion, and the conductive electrons can surmount the potential barrier at the central portion. The reason why increasing the injection electrode potential declines the potential in the central channel region is that, when the potential at the p⁺ injector region 78 arranged in ohmic contact with the injection electrode is increased, minority carriers move to the interface with the insulating film 75, which is in contact with the p⁺ injector region 78, and interrupt the electric filed extending from the MOS electrode 74 of the fixed insulating electrode 76 to the central channel region, thus diminishing the depletion layer in the central channel region. When the injection potential further rises to higher than 0.5 eV, the potential in the central channel region 77 is further decreased, hence making the band of the channel region 77 flat. This results from the junction between the n⁻ drain region 72 and the p⁺ injector region 78 being forward biased to make the entirety of the n⁻ drain region 72 at a highly injected state. At the time, the holes are received directly from the p⁺ injector region 78 and simultaneously, transferred from the interface of the insulating film 75 to the n⁻ drain region 72. More particularly, the insulating film interface under the above conditions acts as a highly conductive transmission path for passing a hole current. At this stage, the control over the drain current may be more understood from the injection current than the view from the potential at the injection electrode. In brief, the conductivity of the n⁻ drain region 72 or the flow of the drain current can be controlled by the hole current injected into the n⁻ drain region 72.

c) Transition from Conducting to Blocking State

The process of transition back from the conducting state to the blocking state of the current-controlled semiconductor element Q1 is explained. For turning the current-controlled semiconductor element Q1 off, the potential at the injection electrode 18 is connected to the ground (OV) or shifted to a negative level. This causes the holes existing in the n⁻ drain region 72 and the channel region 77 to be eliminated or passed through the p⁺ injector region 78 and then discharged out from the current-controlled semiconductor element Q1, hence developing the depletion layer in the channel region 77. This process is identical to a turn-off mechanism of a static induction thyristor (SI thyristor). The bottom of the p⁺ injector region 78 represented in FIG. 1D as if it is deeper than the bottom of the fixed insulating electrode 76. If, the bottom of the p⁺ injector region 78 is deeper than the bottom of the fixed insulating electrode 76, the application of a negative potential to the injection electrode can readily carry out the turning off transition. However, the equivalent function of the device is operable when the depth of the $p^+$ injector region 78 is shallower than the bottom of the fixed insulating electrode 76.

The current-voltage characteristics of the device shown in FIGS. 1A–1D are, like a discrete bipolar transistor (BJT), is similar to the characteristics of a pentode tube. With the current supplied from the injection electrode, the drain current can successfully be released, even if the drain potential is low. When the drain potential is high, the depletion layers extending from the fixed insulating electrodes to the drain region pinch off the channel, and thus the current-voltage characteristics saturates its level. Also, since the drain current is determined by the injected hole current, the rate of amplification of direct current $h_{FE}$ shall be equal to that of the bipolar transistor. As the current-controlled semiconductor element Q1 is very small in the device arrangement and its channel region potential is correlated with the potential at the injection electrode, it may be greater in the $h_{FE}$ rate than the single bipolar transistor.

Next, various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set fourth such as specific signal values, etc. to provide a through understanding of the present invention. However, it will be obvious to those skilled in the art that the present invention may be practiced without such specific details. In other instances, well-known circuits have been shown in block diagram form in order not to obscure the present invention in unnecessary detail.

(First Embodiment)

Figure 2:
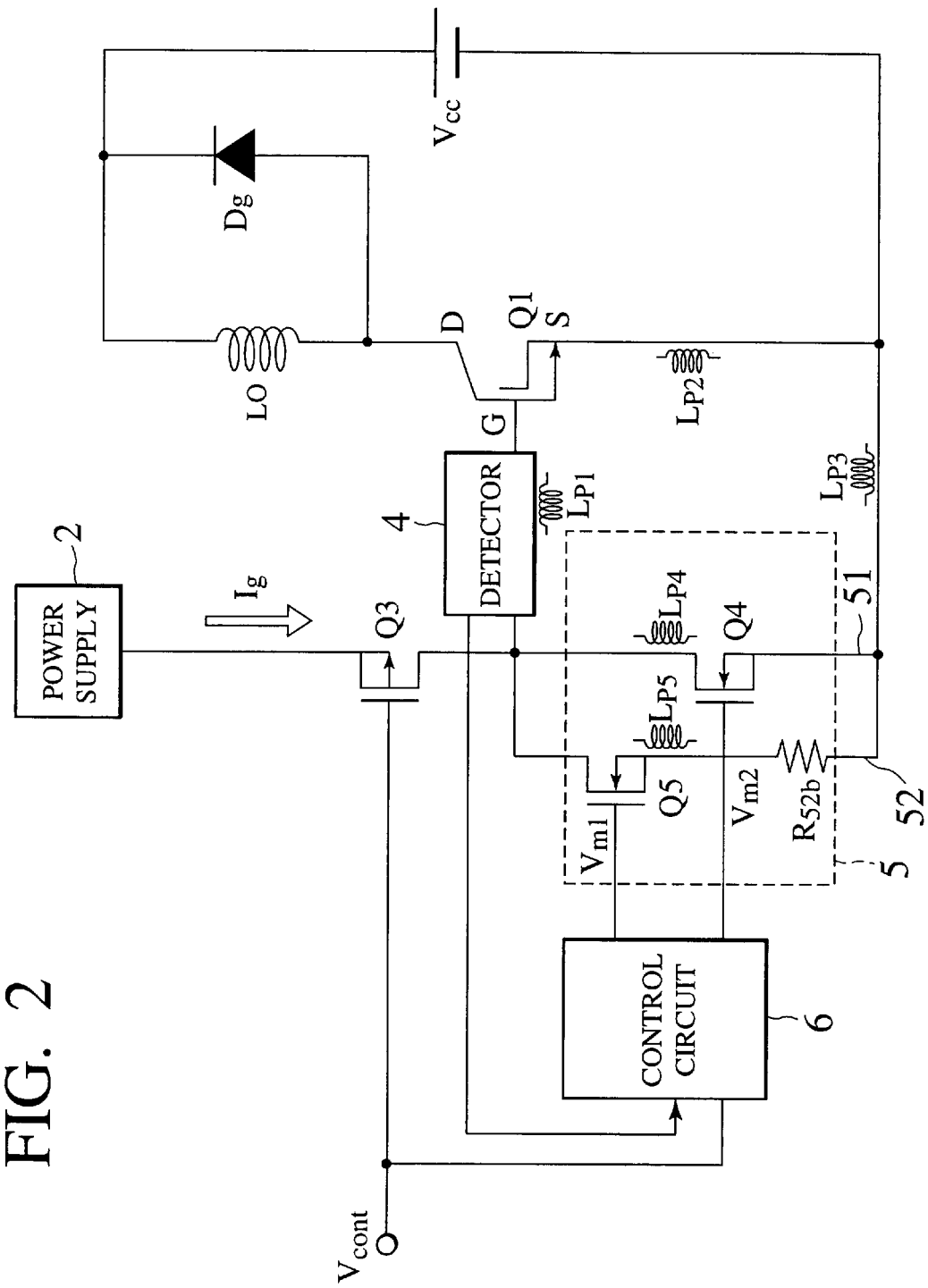
FIG. 2 is a circuit configuration of a semiconductor switching circuit including a drive circuit for driving the semiconductor device according to a first embodiment of the present invention.

FIG. 2 illustrates a semiconductor switching circuit according to a first embodiment of present invention. The semiconductor switching circuit of the first embodiment includes a drive circuit for driving the semiconductor device Q1, which turns on and off so as to control current in the inductive load LO, depending on the signal level at a drive signal input terminal $V_{cont}$. For example, the current-controlled semiconductor element shown in FIGS. 1A–1D can be used as the semiconductor device Q1.

The drive circuit of the first embodiment controls and drives the semiconductor device Q1. The semiconductor device Q1 has a gate electrode G as a control electrode, a source electrode S as a first main electrode and a drain electrode D as a second main electrode. The drive circuit of the first embodiment has a detector 4, a carrier pull out circuit 5 and a control circuit 6, which serves as "a detecting means", "a carrier pull out means" and "a control means" of the present invention, respectively. The detector 4 detects a "specific feature" representing a turn-off transition of the semiconductor device Q1 is just approaching to its completion. The carrier pull out circuit 5 is connected to the detector 4. The carrier pull out circuit 5 pulls out stored carriers from the control electrode G so as to sweep out the storage charges in the semiconductor device Q1. The control circuit 6 maintains the impedance of the carrier pull out circuit 5 at a "first level" in the initial stage of the turn-off transition of the semiconductor device Q1 and, when the detector 4 detects the specific feature, changes the impedance of the carrier pull out circuit 5 to a "second level" higher than the first level. Then, the carrier pull out circuit 5 is configured to change the speed for pulling out the stored carriers from the control electrode G of the semiconductor device Q1 depending on time.

As shown in FIG. 2, the drive circuit of the first embodiment has a power supply 2 for providing a control current Ig to the semiconductor device Q1, a pMOS transistor Q3 for turning on and off the control current Ig. The current detector 4 detects the control current Ig when the carriers are pulled out from the control electrode G of the semiconductor device Q1. A power source Vcc shown in FIG. 2 drives the inductive load LO, and a freewheeling diode 8.

Figure 3:
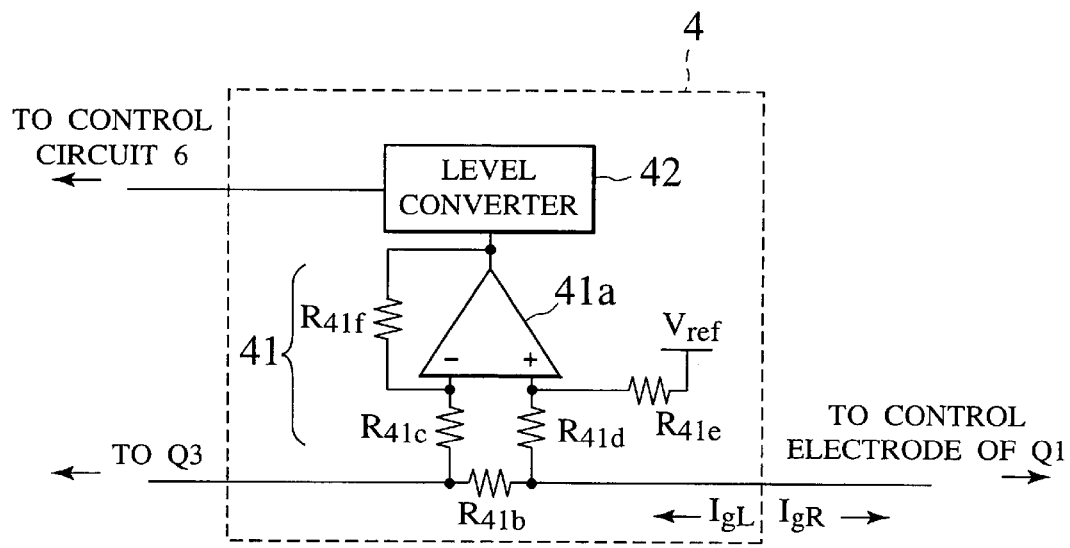
FIG. 3 is a circuit configuration showing a current detector shown in FIG. 2.

The current detector 4 may be arranged as shown in FIG. 3. In FIG. 3, the current detector 4 has a differential amplifier 41 for converting the control current Ig into a voltage signal and a level converter 42 for converting an output of the differential amplifier 41 into a logic level. The differential amplifier 41 consists mainly of an operational amplifier 41a and a group of resistors $R_{41b}$ to $R_{41e}$. The logic output of the differential amplifier 41 is varied depending on the amplitude of the control current, which flows in the direction of pulling out the carriers when the semiconductor device Q1 is turned off. More particularly, when the voltage converted from the control current $I_{gL}$ flowing in the carrier pulling out direction, is equal to or higher than a setting level, the output of the level converter 42 is a high level. The "setting level" may be preferably 2.5 V, which is then used throughout the description of the present invention. When the voltage converted from the control current $I_{gL}$ is lower than the setting level, the output is a low level. Detecting a control current $I_{gL}$, which is fed to the gate of the semiconductor device Q1 when the semiconductor device Q1 is turned on, the current detector 6 provides always a low level detection-signal.

The carrier pull out circuit 5 includes a first carrier pull out path 51 and a second carrier pull out path 52 connected in parallel between the control electrode (gate electrode) and the second main electrode (source electrode) of the semiconductor device Q1. The first carrier pull out path 51 has an nMOS transistor Q4. And the second carrier pull out path 52 has an nMOS transistor Q5 and a resistor $R_{52b}$ connected in series.

Figure 4:
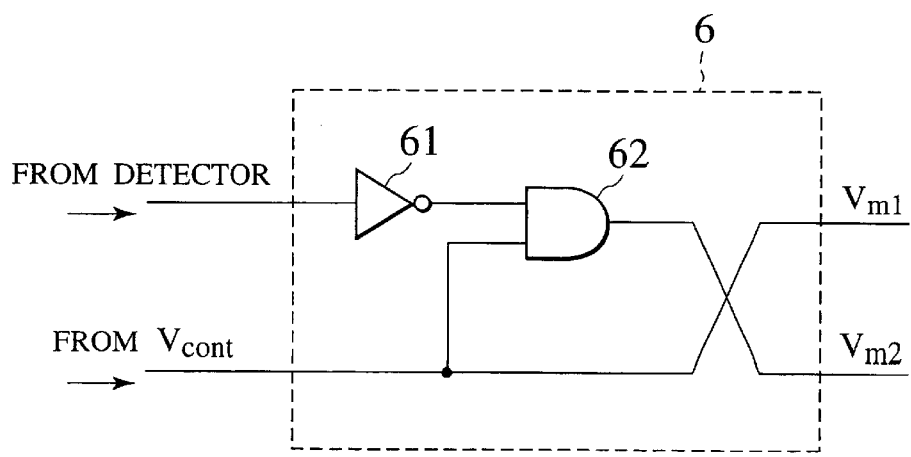
FIG. 4 is a circuit configuration showing a control circuit shown in FIG. 2.

The two nMOS transistors Q4 and Q5 in the carrier pull out circuit 5 are turned on and off by the instruction of the control circuit 6. The control circuit 6 has, as shown in FIG. 4, a NOT gate (an inverter) 61 for receiving a signal from the current detector 4. And an AND circuit 62 has two input terminals. Via one input terminal of the AND circuit 62, an output of the NOT gate 61 is provided, while via the other input terminal a drive signal through the input terminal $V_{cont}$ is provided. The output of the AND gate 62 is connected as a signal $V_{m2}$ to the control electrode of the nMOS transistor Q4 in the carrier pull out circuit 5. The drive signal from the input terminal $V_{cont}$ is also provided as a signal $V_{m1}$ to the control electrode of the nMOS transistor Q5 in the carrier pull out circuit 5. As apparent from FIG. 4, when the drive signal from the input terminal $V_{cont}$ becomes low level, or namely, when the control signal for turning on the semiconductor device Q1 is also transferred to the control circuit 6, the two signals $V_{m1}$ and $V_{m2}$ are at low levels. That is, regardless of the logic levels of the detection-signal transferred from the current detector 4, the two nMOS transistors Q4 and Q5 are turned off in the carrier pull out circuit 5 when the control signal transferred through the input terminal $V_{cont}$ is at low level.

(Operation in Turn-On Transition)

The turn-on transition process of the semiconductor device Q1 according to the first embodiment will now be explained.

When the turn-on control signal is transferred from an external drive unit, although the external drive unit is not shown in FIG. 2 to avoid cluttering up the drawings, the signal at the input terminal $V_{cont}$ shifts from the high level to the low level, turning on the pMOS transistor Q3. At the time, the two output signals $V_{m1}$ and $V_{m2}$ of the control circuit 6 are at low level and the nMOS transistors Q4 and Q5 in the carrier pull out circuit 5 remain in the off states. Accordingly, the control electrode of the semiconductor device Q1 is disconnected from the source electrode of the semiconductor device Q1, and thus supplied with a control current Ig from the power supply (the controlled current source) 2. As the carriers are injected to the control electrode, the semiconductor device Q1 is turned on passing the drive current from the power supply Vcc to the inductive load 10. When the carrier pull out circuit 5 is blocking between the control and source electrodes of the semiconductor device Q1, the impedance of the carrier pull out circuit 5 is at the highest level, which is much higher than the second level.

(Operation in Turn-Off Transition)

Figure 5:
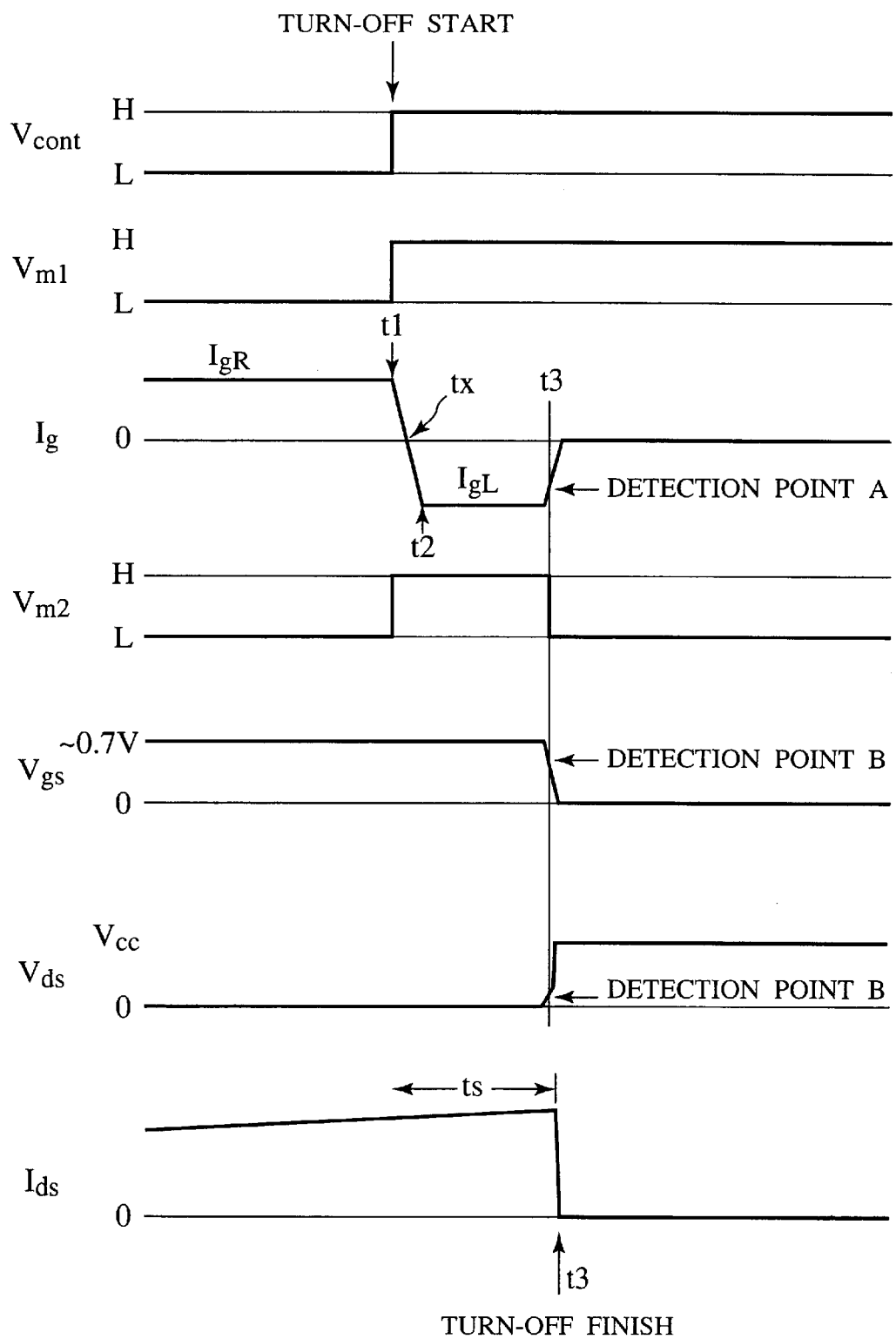
FIG. 5 is a timing chart showing signal waveforms in the drive circuit shown in FIG. 2.

Next, the turn-off transition process of the semiconductor device Q1 according to the first embodiment will be explained, referring to the time chart shown in FIG. 5.

a) At the time t1, when the turn-off control signal is transferred from the external drive unit (not shown in FIG. 2), or the signal level at the input terminal $V_{cont}$ changes from the low level to the high level, the pMOS transistor Q3 turns off, and cut off the supply of the control current Ig. As the control current Ig is flowing towards the source electrode at the time t1, the output of the current detector 4 is at low level. Accordingly, the two signals $V_{m1}$ and $V_{m2}$ transferred from the control circuit 6 are at high level turning on the two nMOS transistors Q4 and Q5 in the carrier pull out circuit 5. This allows the control electrode of the semiconductor device Q1 to be connected to the source electrode through both of the first carrier pull out path 51 and the second carrier pull out path 52. Then the impedance of the carrier pull out circuit 5 becomes the first level, which is very low impedance.

b) The transition from the time t1 to t2 shown in FIG. 5 is explained. At the time t1, a current component flowing in the $I_{gL}$ direction (See FIG. 3) configured to pull out the stored carriers through the control electrode is generated. However, as the current flowing in the $I_{gR}$ direction (See FIG. 3) so as to inject the carriers into the control electrode is greater than the current component $I_{gL}$, at the time t1, the resulting current flows in $I_{gR}$ the direction.

c) After the time t1, the current flowing in the $I_{gL}$ direction gradually increase, while the current flowing in the $I_{gR}$ direction gradually decreases.

d) At the time tx, the current flowing in the $I_{gL}$ direction becomes greater than the current flowing in the $I_{gR}$ direction. Then, the current flowing in the $I_{gL}$ direction becomes dominant.

e) And after the time tx, the current flowing in the $I_{gL}$ direction is further increased. In this manner, the carriers are pulled out from the control electrode. The interval from the time t1 to t2 is very short.

f) As the carriers stored around the control electrode gradually decreased, the control current $I_{gL}$ flowing in the pulling out direction starts decreasing. Upon detecting the decreasing of the control current $I_{gL}$, at the time t3, when the voltage, converted from the control current $I_{gL}$, drops down to lower than 2.5 V, the current detector 4 shifts its output logic level to the high level. The high level signal is transferred to the control circuit 6. The NOT gate (inverter) 61 of the control circuit 6 inverts the high level signal to low level. Then the output signal $V_{m2}$ of the low level is provided from the control circuit 6.

g) The output signal $V_{m2}$ of the low level turns off the nMOS transistor Q4. Then, the first carrier pull out path 51 is disconnected between the control and source electrodes, but the second carrier pull out path 52 remains conducting. This increases the total impedance of the carrier pull out circuit between the control and source electrodes, to the second level higher than the first level, thus retarding the carrier pull out speed. In other words, the carrier pull out is narrowed down, and finally, terminating the sequence of the turn off transitions of the semiconductor device Q1. Since, at this time, the control current is decreased, the energies accumulated in respective parasitic inductors $Lp_1$ to $Lp_5$ are also decreased. Furthermore, the R component, which is a damping factor in the RLC-resonance, increases. As a result, the oscillation of the control electrode voltage is attenuated so as to inhibit the semiconductor device Q1 from accidentally turning on.

According to the first embodiment shown in FIG. 2, the semiconductor device Q1 can be turned off by two stages:

i) connecting the control electrode with the two carrier pull out paths 51 and 52 to provide the low impedance of the first level; and ii) then, when the control current $I_{gL}$ in pulling out the carriers drops down to below a predetermined level and it is judged that the semiconductor device Q1 is about to turn off, cutting of the carrier pull out paths 51, while connecting the control electrode with the other carrier pull out path 52 so as to provide the high impedance of the second level.

This two-stage carrier pull out allows the turn off transition to be quickly carried out and its erroneous operation due to the unexpected oscillation of the control electrode voltage can successfully be prevented. To detect that the level of the control current $I_{gL}$ in pulling out the carriers drops down to below the predetermined level is equivalent to find the specific feature that represents the timing in which the semiconductor device Q1 is about to turn off is approaching, or the turn-off transition of the semiconductor device Q1 is just approaching to its completion.

(Second Embodiment)

Figure 6:
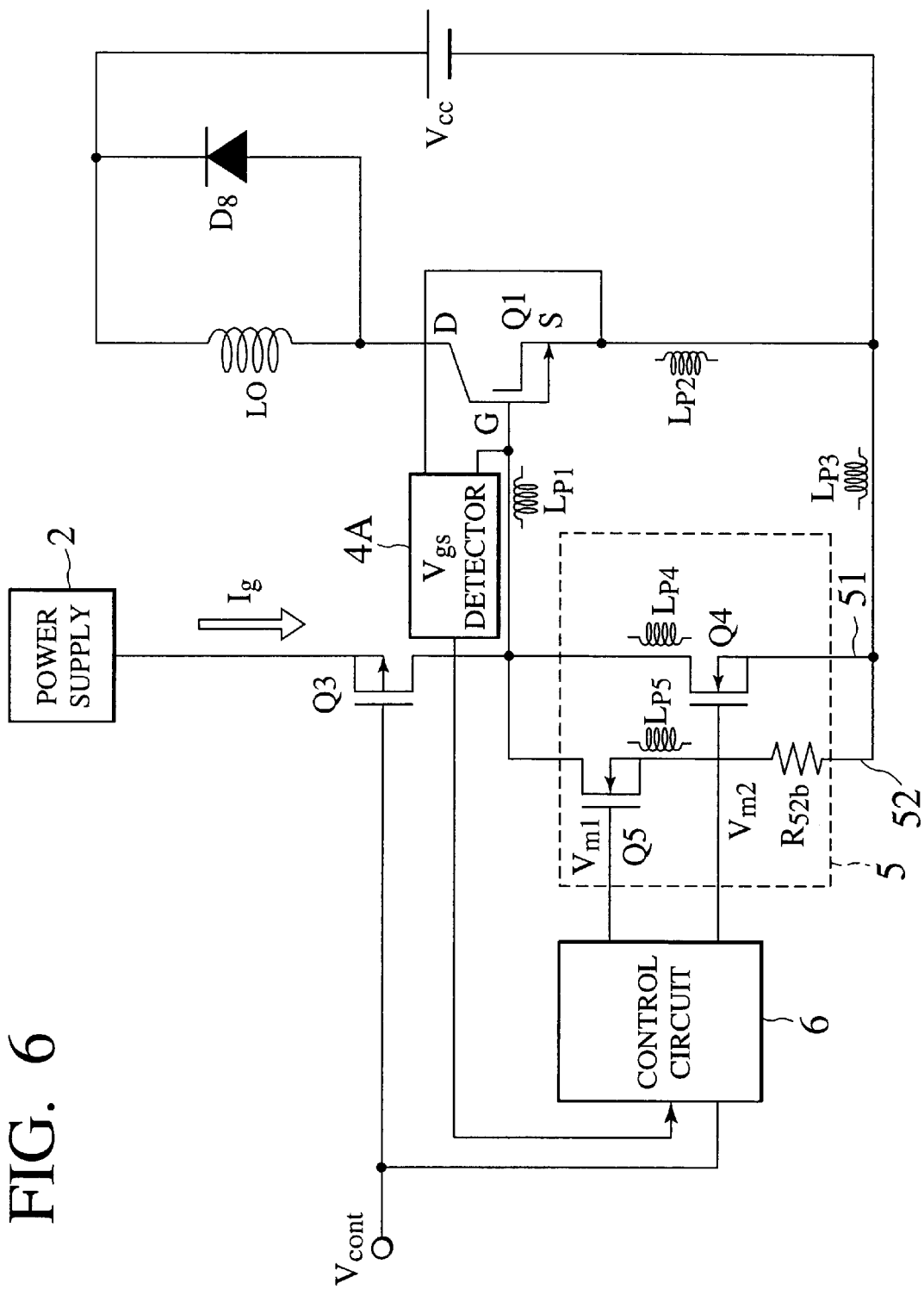
FIG. 6 is a circuit configuration of a semiconductor switching circuit including a drive circuit for driving the semiconductor device according to a second embodiment of the present invention.

FIG. 6 illustrates a semiconductor switching circuit according to a second embodiment of present invention. The semiconductor switching circuit of the second embodiment includes a drive circuit for driving the semiconductor device Q1.

The drive circuit controls and drives the semiconductor device Q1. The semiconductor device Q1 of the second embodiment has a gate electrode G as a control electrode, a source electrode S as a first main electrode and a drain electrode D as a second main electrode, which are exactly same as the first embodiment. The drive circuit of the second embodiment has a detector 4A, a carrier pull out circuit 5 and a control circuit 6, which serves as "a detecting means", "a carrier pull out means" and "a control means" of the present invention, respectively. The detector 4A detects a specific feature representing a turn-off transition of the semiconductor device Q1 is approaching to its completion, similar to the first embodiment. The carrier pull out circuit 5 is connected to the detector 4A. The carrier pull out circuit 5 pulls out stored carriers from the control electrode G. The control circuit 6 maintains the impedance of the carrier pull out circuit 5 at a first level in the initial stage of the turn-off transition of the semiconductor device Q1 and, when the detector 4A detects the specific feature, changes the impedance of the carrier pull out circuit 5 to a second level higher than the first level.

The drive circuit shown in FIG. 2 is adapted in which the impedance of the carrier pull out circuit 5 is varied depending on the control current $I_{gL}$ flowing in the carrier pull out direction. However, in the second embodiment, the impedance of the carrier pull out circuit 5 is varied depending on the voltage $V_{gs}$ between the control and source electrodes.

As shown in FIG. 6, the detector 4A for detecting the voltage $V_{gs}$ between the control electrode and source electrodes is provided between the control electrode G and the source electrode S of the semiconductor device Q1. The output of the detector 4A is connected to the control circuit 6. The $V_{gs}$ voltage detector 4A provides a low level signal to the control circuit 6 when the voltage $V_{gs}$ between the control and source electrodes is equal to or higher than a predetermined level. The predetermined level may be preferably 0.6 V, which will thus be used hereinafter throughout the description. The $V_{gs}$ voltage detector 4A provides a high level signal to the control circuit 6 when it is lower than 0.6 V.

(Operation in Turn-Off Transition)

Next, the turn-off transition process of the semiconductor device Q1 according to the second embodiment is explained referring to FIG. 5.

a) When the turn-off control signal at the input terminal $V_{cont}$ changes from the low level to the high level, the pMOS transistor Q3 turns off, and cut off the supply of the control current Ig. And the turn-off transition of the semiconductor device Q1 is prepared in the same manner as of the first embodiment. This causes the control current $I_{gL}$ to flow from the control electrode of the semiconductor device Q1 in the direction for pulling out the carriers.

b) As the stored carriers around the control electrode gradually decreased, the control current $I_{gL}$ is decreased hence lowering the voltage $V_{gs}$ between the control and source electrodes.

c) When the voltage $V_{gs}$ between the control and source electrodes drops down to lover than the predetermined level, the $V_{gs}$ voltage detector 4A supplies the control circuit 6 with a high level signal.

d) As a result, the output signal $V_{m2}$ of the control circuit 6 is shifted to the low level so as to turn off the nMOS transistor Q4. Since the other signal $V_{m2}$ remains at high level, the nMOS transistor Q5 is held in the on state. This permits the second carrier pull out path 52 to be connected with the control electrode, and the impedance of the carrier pull out circuit 5 is increased.

According to the second embodiment, the semiconductor device Q1 can be turned off by successive two stages:

i) connecting the control electrode with the two carrier pull out paths 51 and 52 to provide the low impedance of the first level; and ii) then, when the voltage $V_{gs}$ between the control and source electrodes has dropped down to a level below the predetermined level, cutting of the carrier pull out paths 51, while connecting the control electrode with the other carrier pull out path 52 so as to provide the high impedance of the second level.

As a result, the decay time in the turn off transition becomes longer while the storage time is same as the conventional circuitry, and its erroneous operation due to the oscillation of the control electrode voltage can successfully be prevented, by the suppression of the oscillation of the control electrode.

(Third Embodiment)

Figure 7:
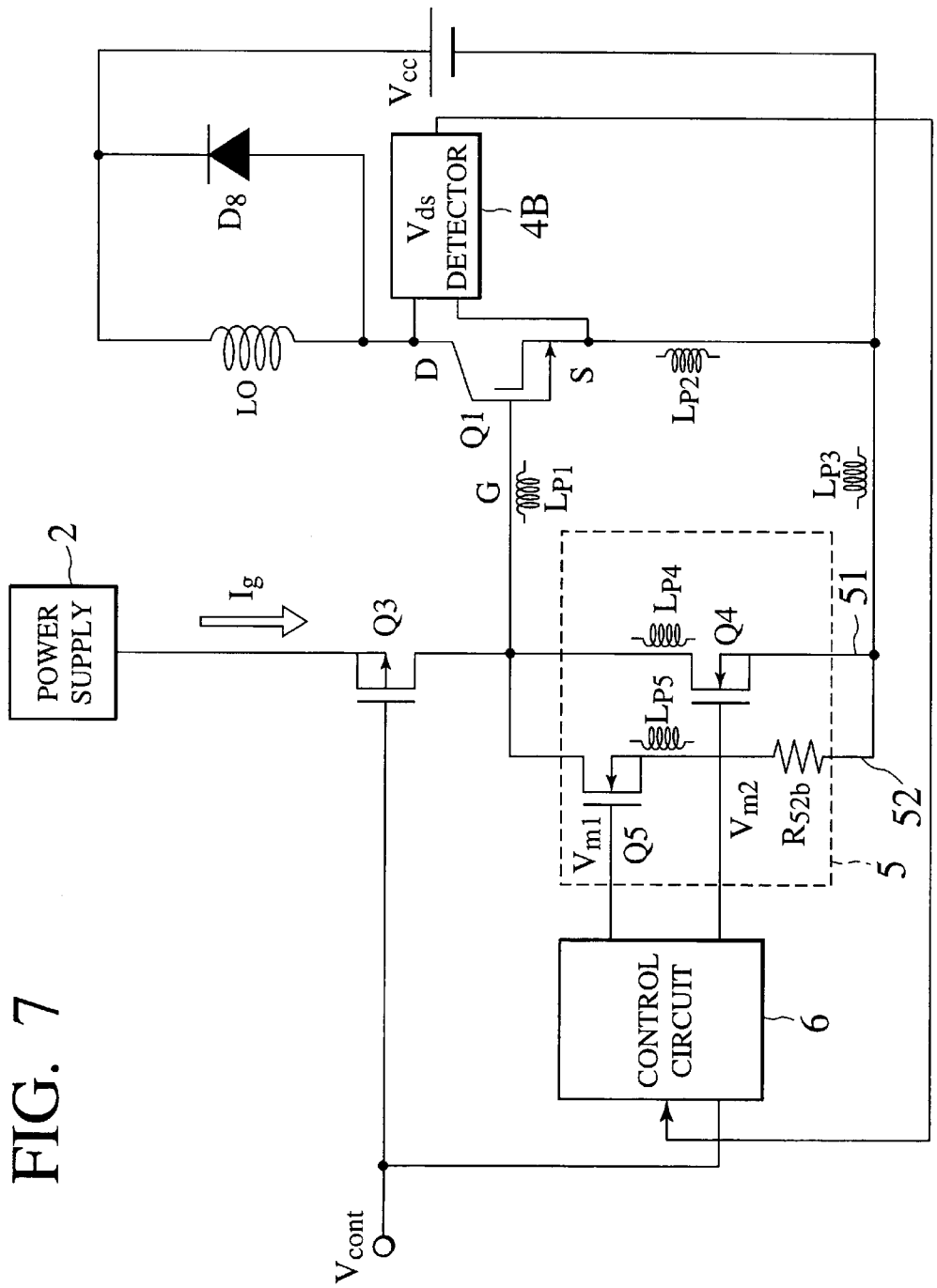
FIG. 7 is a circuit configuration of a semiconductor switching circuit including a drive circuit for driving the semiconductor device according to a third embodiment of the present invention.

FIG. 7 illustrates a semiconductor switching circuit according to a third embodiment of present invention. The semiconductor switching circuit of the third embodiment includes a drive circuit for driving the semiconductor device Q1. The difference of this embodiment from that shown in FIG. 2 will mainly be described. According to the third embodiment, the impedance of the carrier pull out circuit 5 is varied depending on the voltage $V_{ds}$ (or, a voltage drop of the drive current) between the drain source electrodes of the semiconductor device Q1. A detector 4B for detecting the voltage $V_{ds}$ between the drain and source electrodes is provided between the drain electrode and the source electrode. The $V_{ds}$ voltage detector 4B provides a low level signal to the control circuit 6 when the voltage $V_{ds}$ between the drain and source electrodes drops down to a level below a predetermined level and a high level signal when it is equal to or equal to or higher than the predetermined level.

(Operation in Turn-Off Transition)

Next, the turn-off transition process of the semiconductor device Q1 according to the third embodiment will be explained referring to FIG. 7.

a) When the turn-off control signal is supplied from an external drive unit (not shown in FIG. 7), or the signal at the input terminal $V_{cont}$ changes from the low level to the high level, the pMOS transistor Q3 turns off, and cut off the supply of the control current Ig. And the turn-off transition of the semiconductor device Q1 is prepared in the same manner as the first embodiment. This causes the control current $I_{gL}$ flowing in the direction for pulling the carriers from the control electrode of the semiconductor device Q1 to decrease.

b) As shown in FIG. 5, when the control electrode signal $V_{m1}$ is shifted to the high level at the time t1, the current will still continue to flow between the drain and source electrodes until the actual turn-off transition of the semiconductor device Q1 is initiated. Then the voltage $V_{ds}$ between the drain and source electrodes is substantially zero until the actual turn-off transition starts.

c) As the control current is decreased enough to cutoff between the drain and source electrodes, the voltage $V_{ds}$ between the drain and source electrodes starts increasing.

d) When the voltage $V_{ds}$ between the drain and source electrodes exceeds the predetermined level at the time t3, the $V_{ds}$ voltage detector 4B supplies the control circuit 6 with a high level signal.

e) As a result, the output signal $V_{m2}$ of the control circuit 6 is shifted to the low level, hence turning off the nMOS transistor Q4. Then, only the second carrier pull out path 52 is connected to the control electrode, and the impedance of the carrier pull out circuit 5 increases.

According to the third embodiment shown in FIG. 7, the semiconductor device Q1 can be turned off by successive two stages:

i) connecting the control electrode with the two carrier pull out paths 51 and 52 to provide the low impedance of the first level; and ii) then, when the voltage $V_{ds}$ between the drain and source electrodes exceeds a predetermined level, connecting the control electrode only with the carrier pull out path 52, cutting of the carrier pull out paths 51 so as to provide the high impedance of the second level.

As a result, the decay time in the turn off transition becomes longer while the storage time is same as the conventional circuitry, and its erroneous operation due to the oscillation of the control electrode voltage can successfully be prevented.

The third embodiment is adapted that the impedance of the carrier pull out circuit is changed when the change in the voltage $V_{ds}$ between the drain and source electrodes indicates that the semiconductor device Q1 is about to turn off. Consequently, as compared with the first and second embodiments where the operation is triggered by detecting an imperceptible change in the control voltage $I_{gL}$ (e.g. a few percent of one milliampere) or the voltage $V_{gs}$ between the control and source electrodes (e.g. a few percent of 0.7 volt), the change is relatively large (e.g. a few percent of 100 volts). Hence the changes of the voltage $V_{ds}$ between the drain and source electrodes are measured at higher accuracy. On the contrary, the methodology of detecting the change of the control current $I_{gL}$ explained in the first embodiment has a technical advantage, in which the response speed becomes high.

(Fourth Embodiment)

Figure 8:
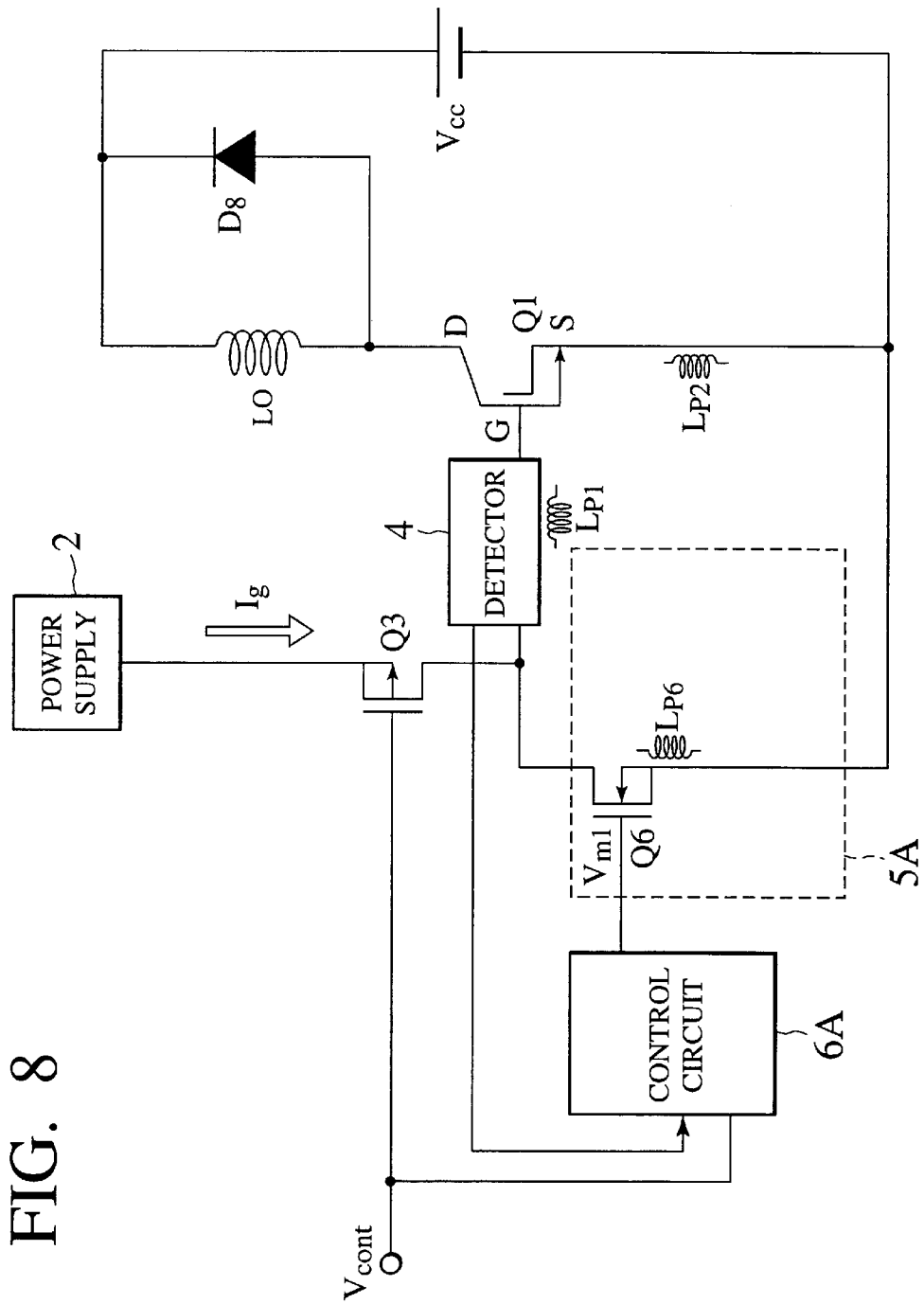
FIG. 8 is a circuit configuration of a semiconductor switching circuit including a drive circuit for driving the semiconductor device according to a fourth embodiment of the present invention.

FIG. 8 illustrates a semiconductor switching circuit according to a fourth embodiment of the present invention. The semiconductor switching circuit of the fourth embodiment includes a drive circuit for driving the semiconductor device Q1. The difference from the first embodiment shown in FIG. 2 will mainly be explained. The first and second carrier pull out paths 51 and 52 in the carrier pull out circuit 5 shown in FIG. 2 are replaced by the switching operation of a single carrier pull out path, which can vary the impedance.

The carrier pull out circuit 5A for the semiconductor device Q1 according to the fourth embodiment of the present invention incorporates an nMOS transistor Q6 that provides an on-state resistance $r_{on}$, the on-state resistance $r_{on}$ varies according to the voltage applied to its control electrode. More specifically, the on-state resistance $r_{on}$ can be varied by changing the output signal $V_{m1}$ of the control circuit 6 or namely the voltage at the control electrode of the nMOS transistor Q6 in response to the control current $I_{gL}$ flowing in the carrier pull out direction.

When the control current $I_{gL}$ flowing in the carrier pull out direction exceeds a predetermined level, the detector 4 supplies a control circuit 6 with a low level detection-signal. The control circuit 6A provide a sequence of output signals, namely first and second output signals. The first output signal from the control circuit 6A is a first control electrode voltage signal $V_{m1HH}$ for decreasing the on-state resistance $r_{on}$ of the nMOS transistor Q6. Upon receiving a high level detection-signal transferred from the current detector 4 when the control current $I_{gL}$ drops down to below the predetermined level, the control circuit 6A provides a second output signal. The second output signal is a second control electrode voltage $V_{m1HL}$ for increasing the on-state resistance $I_{on}$ of the nMOS transistor Q6.

$$V_{m1HL} < V_{m1HH} \tag{1}$$

In the meantime, while the turn-on control signal is received, the input terminal $V_{cont}$ is set to be at low level. This causes the control circuit 6A to delivery a low level of the output signal $V_{m1}$ hence turning off the nMOS transistor Q6 in the carrier pull out circuit 5A. As a result, between the control electrode and the source electrode of the semiconductor device Q1 is disconnected so as to allow the control electrode to receive a control current from the power supply (the controlled current source) 2. Then the semiconductor device Q1 turns on by the control current.

(Operation in Turn-Off Transition)

Next, the turn-off transition process of the semiconductor device Q1 according to the fourth embodiment will now be explained referring to the time chart shown in FIG. 5, which has already been explained in the first embodiment.

a) As the turn-off control signal is supplied from an external drive unit (not shown in FIG. 8), or the signal at the input terminal $V_{cont}$ changes from the low level to the high level, the pMOS transistor Q3 turns off, and cut off the supply of the control current Ig. Then the turn-off transition of the semiconductor device Q1 is prepared as in the same manner as that of the first embodiment.

b) The control current $I_{gL}$ generated by pulling out the stored carriers from the control electrode of the semiconductor device Q1 is then gradually decreases. The control current detector 4 provide a high level detection-signal. When the control current $I_{gL}$ drops down to a level below a first predetermined level. Upon receiving the high level detection-signal transferred from the control current detector 4, the control circuit 6A outputs the first high-level signal $V_{m1HH}$. When the control electrode of the nMOS transistor Q4 receives the first high-level signal $V_{m1HH}$, the on-state resistance $r_{on}$ of the nMOS transistor Q4 is relatively small.

c) When the control current $I_{gL}$ further decreases to a level below a second predetermined level, the control current detector 4 provide a low level detection-signal. Upon receiving the low level detection-signal transferred from the control current detector 4, the control circuit 6A outputs the second high-level signal $V_{m1HL}$. When the control electrode receives the second high-level signal $V_{m1HL}$, the on-state resistance $r_{on}$ of the nMOS transistor Q4 is higher than the value when the nMOS transistor Q4 received the first high level signal $V_{m1HH}$.

In summary, for turning off the semiconductor device Q1, the output of the control circuit 6A is set to be the first high level signal $V_{m1HH}$ when the control current $I_{gL}$ is large at the initial stage, so as to decrease the on-state resistance $r_{on}$ of the nMOS transistor Q4. In other words, the control electrode of the semiconductor device Q1 is connected to the carrier pull out circuit of low impedance at the initial stage so as to provide the low impedance of the first level.

Then, when the control current $I_{gL}$ for the semiconductor device Q1 drops down to the level below the predetermined level, the control circuit 6A provides the second high level signal $V_{m1HL}$, hence increasing the on-state resistance $r_{on}$ of the nMOS transistor Q4. As a result, the control electrode of the semiconductor device Q1 is connected to the carrier pull out circuit of high impedance at a later stage so as to provide the high impedance of the second level.

Accordingly, the decay time in the turn off transition becomes longer while the storage time is same as the conventional circuitry, and its erroneous operation due to attenuation of the oscillation of the control electrode voltage can successfully be prevented.

(Fifth Embodiment)

Figure 9:
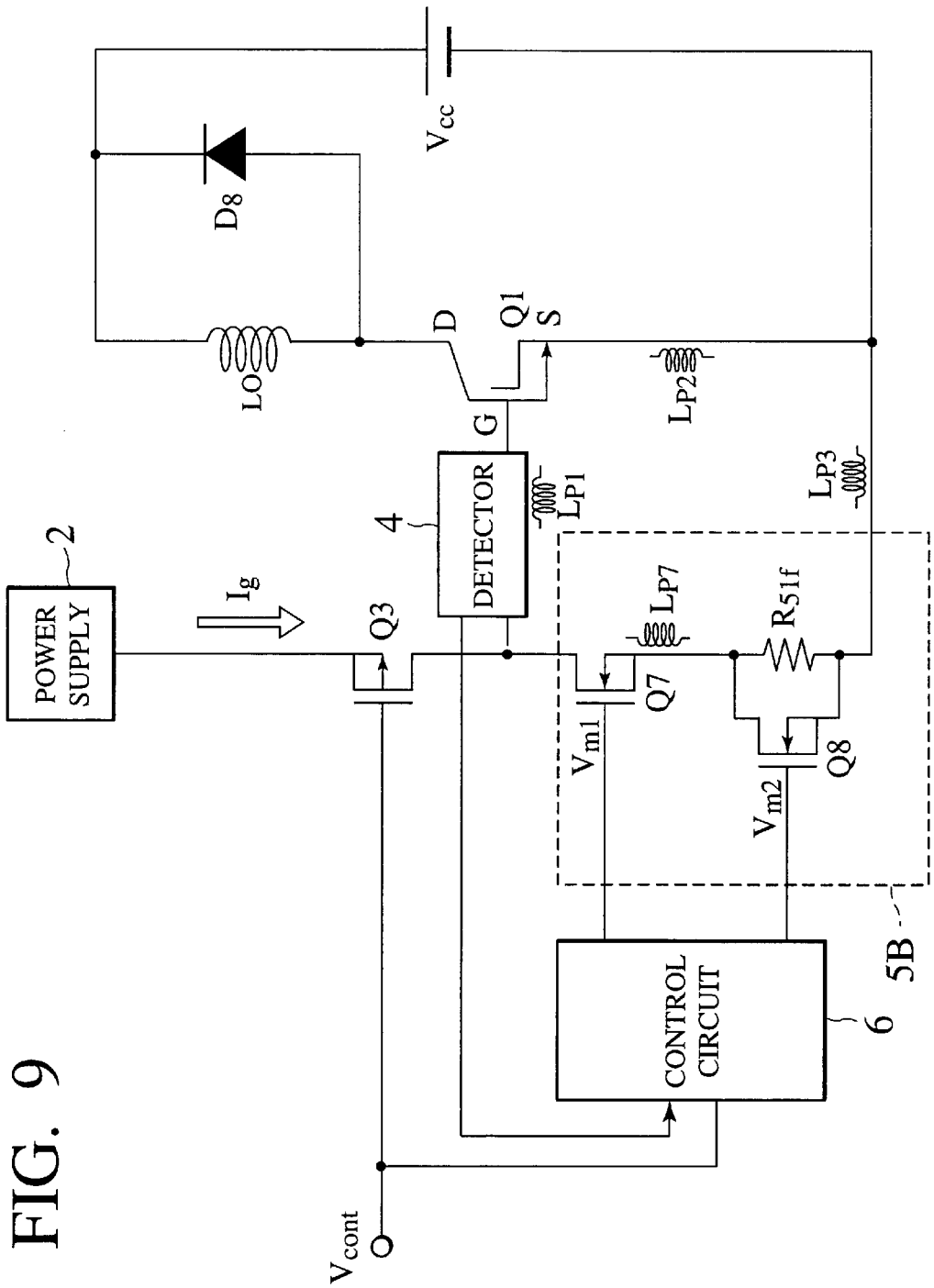
FIG. 9 is a circuit configuration of a semiconductor switching circuit including a drive circuit for driving the semiconductor device according to a fifth embodiment of the present invention.

FIG. 9 illustrates a semiconductor switching circuit according to a fifth embodiment of the present invention. The semiconductor switching circuit of the fifth embodiment includes a drive circuit for driving the semiconductor device Q1. The difference from the first embodiment shown in FIG. 2 will mainly be described. Especially, the carrier pull out circuit 5B of the fifth embodiment is different from that of the first embodiment.

The carrier pull out circuit 5B is connected to the control electrode of the semiconductor device Q1, and has a couple of nMOS transistors Q4 and Q8 connected in series. Further, a resistor $R_{51f}$ is connected in parallel with the nMOS transistor Q8. The on-state resistance $r_{on}$ of the nMOS transistor Q8 is selected to be smaller than the resistance R of the resistor $R_{51f}$. When the two nMOS transistors Q7 and Q8 are turned on, the impedance of the carrier pull out circuit 5B becomes low. However, when the nMOS transistor Q7 is controlled to be turned on and nMOS transistor Q8 is turned off, the impedance of the carrier pull out circuit 5B becomes high.

(Operation in Turn-On Transition)

The turn-on transition process of the semiconductor device Q1 according to the fifth embodiment will now be explained.

a) When the turn-on control signal is supplied from an external drive unit (not shown in FIG. 9), the signal at the input terminal $V_{cont}$ shifts from the high level to the low level, thus turning on the pMOS transistor Q3 in the same manner as that of the first embodiment to provide the control current Ig into the control electrode of the semiconductor device Q1.

b) Simultaneously, the control circuit 6 receives the low level signal. by the low level signal transferred through the input terminal $V_{cont}$, the control circuit 6 provides an output signal $V_{m1}$ with the low level to the nMOS transistor Q7. Then, the nMOS transistor Q7 in the carrier pull out circuit 5B turns off, and the carrier pull out circuit 5B becomes an open state. As the carrier pull out circuit 5B disconnects between the control and source electrodes of the semiconductor device Q1, the control electrode of the semiconductor device Q1 is supplied effectively with the control current, thus turning on the semiconductor device Q1.

(Operation in Turn-Off Transition)

Next, the turn-off transition process of the semiconductor device Q1 according to the fifth embodiment will be explained.

a) When the turn-off control signal is received from the external drive unit (not shown in FIG. 9), the signal at the input terminal $V_{cont}$ changes from the low level to the high level, thus preparing the start of the turn-off transition of the semiconductor device Q1. That is, the high level signal turns off the pMOS transistor Q3 to block the supply of the control current Ig.

b) Simultaneously, the two output signal $V_{m1}$ and $V_{m2}$ of the control circuit 6 are changed to the high level so as to turn on both the nMOS transistors Q7 and Q8 in the carrier pull out circuit 5B. As the carrier pull out circuit 5B is conducting with the two nMOS transistors Q7 and Q8 which are at their on state, its impedance is low. Accordingly, the carriers can rapidly be pulled out from the control electrode, hence turning off the semiconductor device Q1.

c) As the control current $I_{gL}$ flowing in the carrier pull out direction gradually decreases to a level below a predetermined level, the control current detector 4 provides a high level signal. Upon receiving the high level detection-signal transferred from the control current detector 4, the control circuit 6 provides two output signals $V_{m1}$ and the $V_{m2}$. The two output signals $V_{m1}$ and the $V_{m2}$ of the control circuit 6 are signals with the high level and the low level respectively.

d) The output signal $V_{m2}$ turns off the nMOS transistor Q8, while the output signal $V_{m1}$ maintains the on state of the nMOS transistor Q7.

Consequently, in the carrier pull out circuit 5B, the impedance is defined by the on-state resistance $r_{on}$ of the nMOS transistor Q7 and the resistance of the resistor $R_{51}$. Then the impedance of the carrier pull out circuit 5B becomes higher than the initial stage of the turn off transition. As a result, the carrier pull out speed is retarded in the later stage until the semiconductor device Q1 is completely turned off. At the time, as the control current is decreased, the energy stored in parasitic inductors $Lp_1$ to $Lp_3$ and $Lp_7$ becomes small and also the R component which is a damping factor in RLC resonance is increased. Accordingly, the oscillation of the control electrode voltage can be attenuated, thus inhibiting the semiconductor device Q1 from being accidentally turned off.

(Sixth Embodiment)

Figures 10, 11:
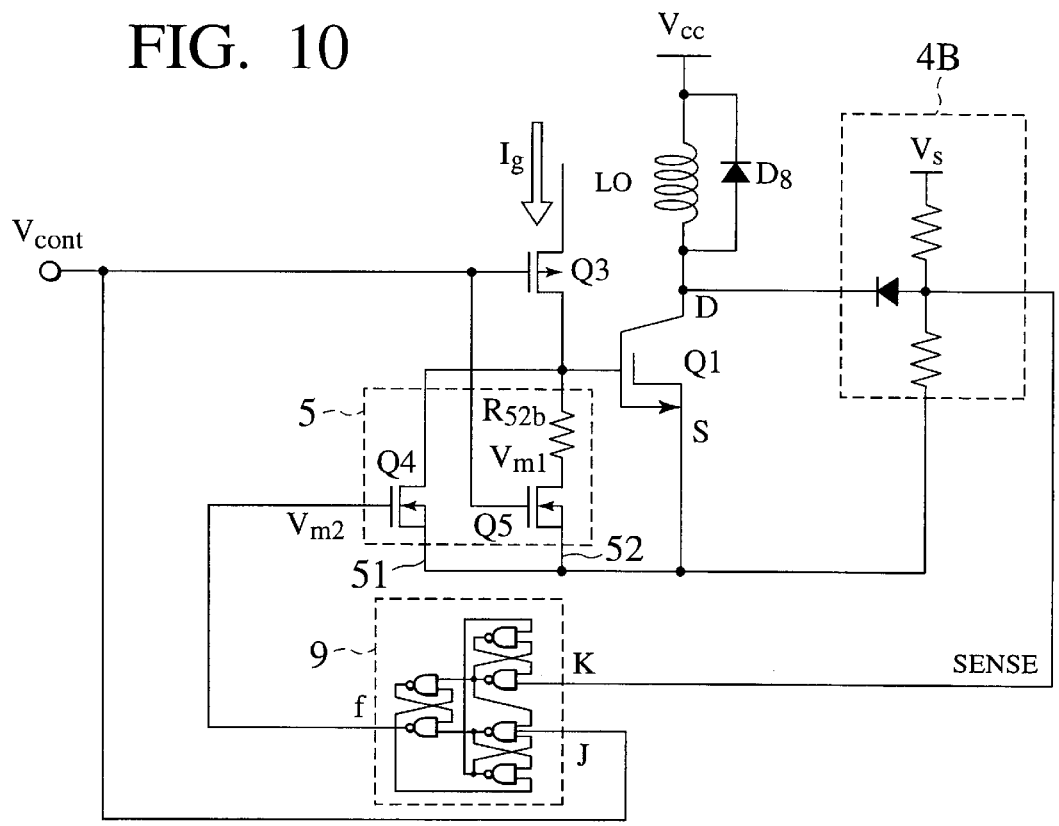
FIG. 10 is a circuit configuration of a semiconductor switching circuit including a drive circuit for driving the semiconductor device according to a sixth embodiment of the present invention.
FIG. 11 is a truth table for a latch circuit.

FIG. 10 illustrates a semiconductor switching circuit according to a sixth embodiment of present invention. The semiconductor switching circuit of the sixth embodiment includes a drive circuit for driving the semiconductor device Q1. This embodiment involves a modification of the drive circuit of the third embodiment shown in FIG. 7. The difference from the first and third embodiments will mainly be described.

In the sixth embodiment, the nMOS transistor Q4 forming the first carrier pull out circuit 51 is turned on/off by the operation of a latch circuit 9 while the nMOS transistor Q5 forming the second carrier pull out circuit 52 is turned on/off by the signal at the input terminal $V_{cont}$. The latch circuit 9 is a JK flip-flop having two input terminals "J" and "K" and one output terminal "f" from which one of logic outputs is selectively transferred. The latch circuit 9 operates based on a truth table shown in FIG. 11. In the truth table shown in FIG. 11, "fp" represents a previous state of the transition at the terminal "f". The latch circuit 9 receives a detection-signal "SENSE" from the $V_{ds}$ voltage detector 4B at the input terminal "K" and the signal transferred from the input terminal $V_{cont}$ at the input terminal "J".

(Operation in Turn-On Transition)

Figure 12:
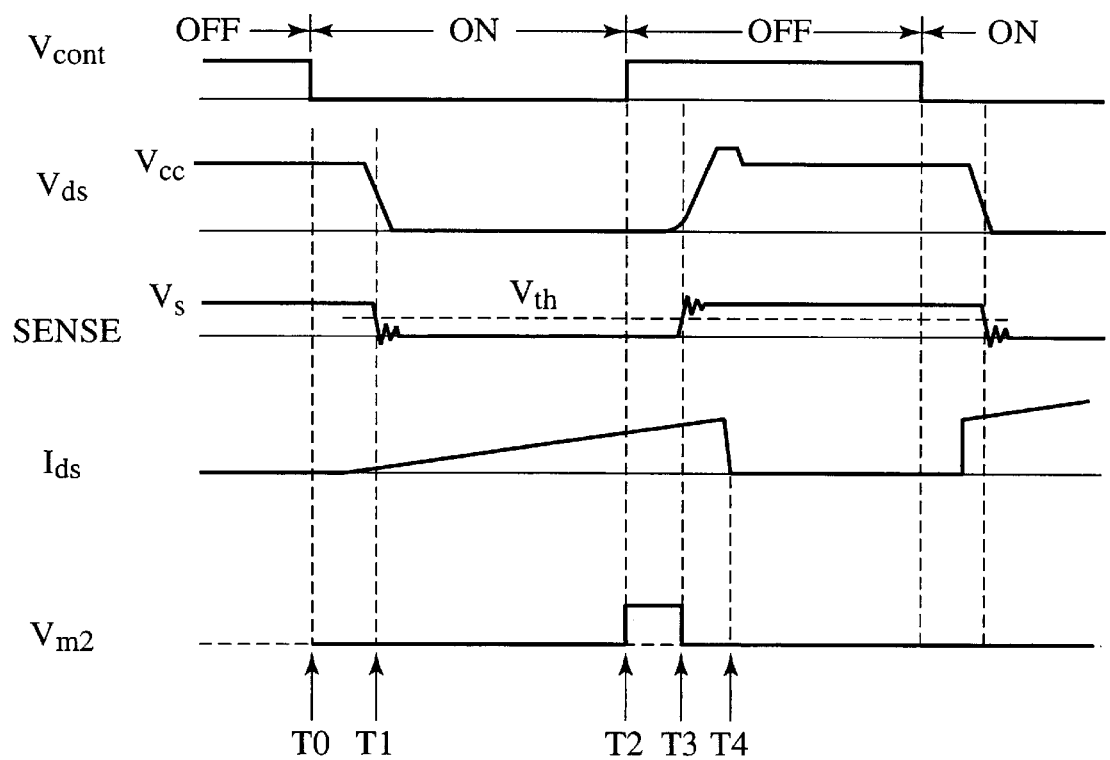
FIG. 12 is a timing chart showing signal waveforms in the drive circuit shown in FIG. 10.

The turn-on transition process of the semiconductor device Q1 according to the sixth embodiment will now be explained referring to a time chart shown in FIG. 12.

a) At the time T0, the turn-on control signal with low level is received at the input terminal $V_{cont}$ from an external drive unit (not shown in FIG. 10) so as to turn on the pMOS transistor Q3. Turning on of the pMOS transistor Q3 allows the control current Ig to be fed to the semiconductor device Q1 for turning on the semiconductor device Q1. However, at the time T0, as the semiconductor device Q1 still remains to be in the off state actually, both the voltage $V_{ds}$ between the drain and source electrodes and the detection-signal is at the high level. Then, the detection-signal "SENSE" provides from the $V_{ds}$ voltage detector 4B, employing the value of the voltage $V_{ds}$ between the drain and source electrodes, is also at the high level. The detection-signal "SENSE" of the high level is provided at input terminal "K".

b) At the input terminal "J", the input signal of low level from the input terminal $V_{cont}$ is supplied. Accordingly, the latch circuit 9 provides a low level signal at the output terminal "f". Then, the pMOS transistor Q3 becomes on state, while the two nMOS transistors Q4 and Q5 turn both into off state.

c) Upon receiving the control current Ig, the control electrode of the semiconductor device Q1 is supplied with the carriers so as to continue the turn-on transition of the semiconductor device Q1. The voltage $V_{ds}$ between the drain and source electrodes of the semiconductor device Q1 starts decreasing. At the time T1, when the voltage $V_{ds}$ between the drain and source electrodes of the semiconductor device Q1 is sufficiently decreased to provide the detection-signal "SENSE" of the low level, from the $V_{ds}$ voltage detector 4B.

d) At the input terminal "J", the input signal of the low level from the input terminal $V_{cont}$ is still supplied at the time T1. Then, the latch circuit 9 provides at its output terminal "f" a low level signal, which is the previous logic state before the transition at the time T1 (See the truth table shown in FIG. 11). Then, two nMOS transistors Q4 and Q5 keep the off state by the low level signals provided from the output terminal "f".

(Operation in Turn-Off Transition)

The turn-off transition process of the semiconductor device Q1 according to the sixth embodiment will now be explained referring to the time chart shown in FIG. 12.

a) At the time T2, the turn-off control signal with high level is received at the input terminal $V_{cont}$, from the external drive unit (not shown in FIG. 10) so as to turn off the pMOS transistor Q3.

b) Then, the blocking state of the pMOS transistors Q3 cutoff the control current Ig which has been supplied to the semiconductor device Q1. The high level signal at the input terminal $V_{cont}$ also turns on the nMOS transistor Q5, so as to start pulling out the stored carriers from the control electrode of the semiconductor device Q1. Then, the turn-off transition of the semiconductor device Q1 will start.

c) Although the turn-off transition of the semiconductor device Q1 has started, at this time T2, the semiconductor device Q1 is still remaining in the on state, actually. And both of the voltage $V_{ds}$ between the drain and source electrodes and the detection-signal "SENSE" transferred from the $V_{ds}$ voltage detector 4B are still at the low level. Namely, the detection-signal "SENSE" of the low level is provided at the input terminal "K".

d) As stated above, at the input terminal "J", the input signal of high level from the input terminal $V_{cont}$ is supplied. Accordingly, the latch circuit 9 provides a high level signal at the output terminal "f", which turns on the nMOS transistor Q4.

e) As a result, the carriers are pulled out from the control electrode of the semiconductor device Q1 using both the first carrier pull out path 51 and the second carrier pull out path 52.

f) Then, as the turn-off transition of the semiconductor device Q1 proceeds, the voltage $V_{ds}$ between the drain and source electrodes increases, and the detection-signal "SENSE", transferred by the $V_{ds}$ voltage detector 4B, rises up to a high level exceeding a logic threshold voltage level (Vth) required at the input terminal "K" of the latch circuit 9.

g) At the input terminal "J", the input signal of high level from the input terminal $V_{cont}$ is still supplied at the time T3. Then, at the time T3, when the detection-signal "SENSE" having the high level is supplied to the input terminal "K", the latch circuit 9 provides at its output terminal "f" an inverted value of the previous logic state before the transition at the time T3. Namely, a low level signal is provided at output terminal "f", since the previous logic state before the transition at the time T3 was the high level.

h) The low level signal provided from the output terminal "f" turns off the nMOS transistor Q4. Then, the carriers to be pulled out from the control electrode are limited to flow into the second carrier pull out path 52 having higher impedance with resistance $R_{52b}$, since the first carrier pull out path 51 is now cutoff. As a result, the impedance of the carrier pull out circuit 5 between the control and source electrodes is increased. This high impedance of carrier pull out circuit 5 retards the carrier pull out speed. And, finally the semiconductor device Q1 completes the turn-off transition at the time T4 as shown in FIG. 12.

The following is the technical features of the drive circuit for driving the semiconductor device Q1 according to the sixth embodiment of the present invention:

Now, we must consider the case that, in the period from the time T3 to T4, the voltage $V_{ds}$ between the drain and source electrodes might unfavorably be oscillated by the effects of parasitic impedances even though the carrier pull out speed is retarded. The oscillation of the voltage $V_{ds}$ between the drain and source electrodes causes the detection-signal "SENSE" from the detector 4B to oscillate. Then, in the circuit configuration of the third embodiment shown in FIG. 7, the oscillation of the detection-signal "SENSE" may turn on the nMOS transistor Q4, which has already been turned off, if we plan to control the operation of the nMOS transistor Q4 by the direct supply of the detection-signal "SENSE" (which is different from the configuration shown in FIG. 10).

However, the drive circuit of the sixth embodiment shown in FIG. 10 allows its latch circuit 9 to latch the output signal to a low level at the output terminal "f". Accordingly, the nMOS transistor Q4 once turned off at the time T3 is inhibited from being turned on before the time T1, when the turn-off transition of the semiconductor device Q1 is completed. The technical advantage of the sixth embodiment is that any erroneous switching operation of the nMOS transistor Q4 is successfully inhibited, thus suppressing the generation of voltage surges throughout the circuit, and improving the noise immunity.

(Seventh Embodiment)

Figures 13, 14:
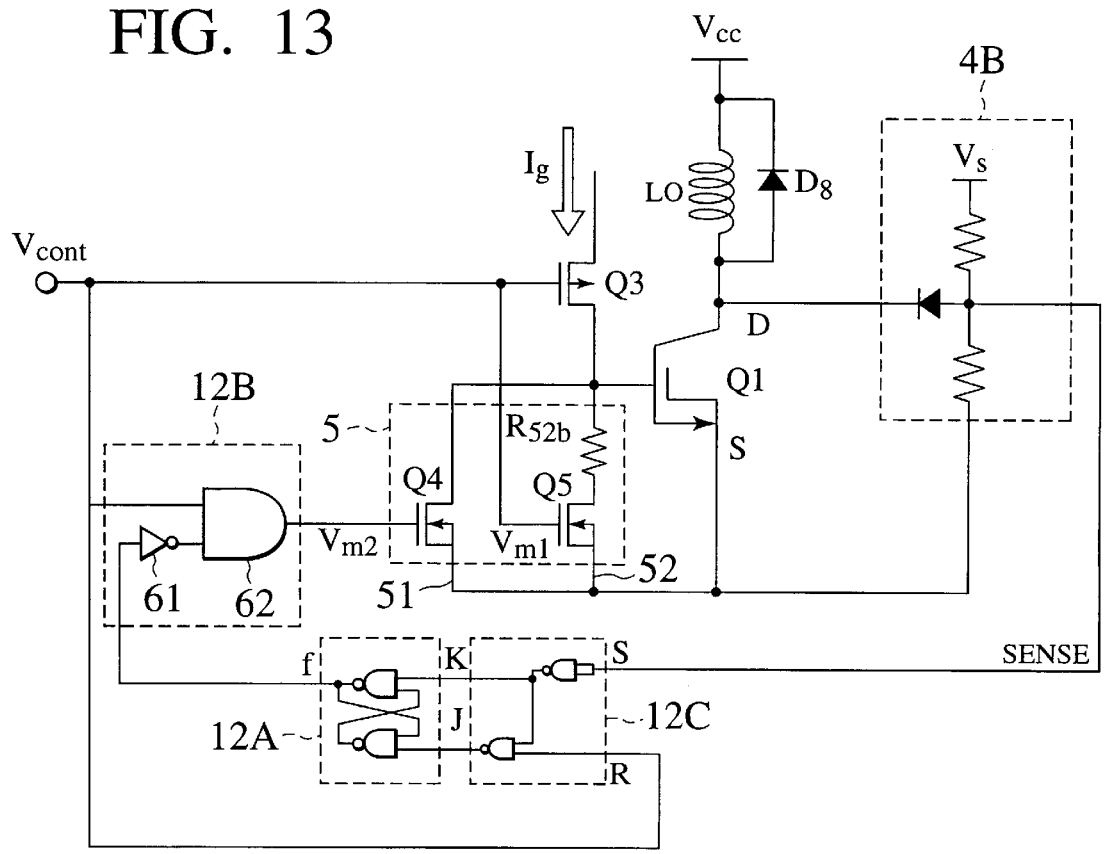
FIG. 13 is a circuit configuration of a semiconductor switching circuit including a drive circuit for driving the semiconductor device according to a seventh embodiment of the present invention.
FIG. 14 is a truth table for a logic circuit and a latch circuit.

FIG. 13 illustrates a semiconductor switching circuit according to a seventh embodiment of the present invention. The semiconductor switching circuit of the seventh embodiment includes a drive circuit for driving the semiconductor device Q1. The seventh embodiment shows another modification of the drive circuit of the third embodiment shown in FIG. 7. The difference from the first, third and sixth embodiments will mainly be explained.

In the seventh embodiment, the nMOS transistor Q4 forming the first carrier pull out circuit 51 is turned on/off by the operation of a logic circuit 12B while the nMOS transistor Q5 forming the first carrier pull out circuit 52 is turned on/off by the signals supplied from the input terminal $V_{cont}$. The logic circuit 12B has a NOT gate 61 and an AND gate 62, which is the similar configuration of the control circuit 6 of the first embodiment shown in FIG. 4. In FIG. 13, the input terminal of the NOT gate 61 is connected with the output terminal "f" of a latch circuit 12A.

The latch circuit 12A has two input terminals "J" and "K" and one output terminal "f". The two input terminals "J" and "K" of the latch circuit 12A are connected with two output terminals of a logic circuit 12C. While the logic circuit 12C has two input terminals "S" and "R", the operation of a combination of the logic circuit 12C and the latch circuit 12A is based on a truth table shown in FIG. 14. In the truth table shown in FIG. 14, "fp" represents a previous state of the transition at the terminal "f". The logic circuit 12C receives at its input terminal "S" the detection-signal "SENSE" from the $V_{ds}$ voltage detector 4B and at its input terminal "R" the signal transferred from the input terminal $V_{cont}$.

(Operation in Turn-on Transition)

The turn-on transition process of the semiconductor device Q1 according to the seventh embodiment will now be explained referring to a time chart shown in FIG. 15.

a) At the time T0, the turn-on control signal with low level is supplied from an external drive unit (not shown in FIG. 13) at the input terminal $V_{cont}$, so as to turn on the pMOS transistor Q3. This allows the control current Ig to be fed into the semiconductor device Q1, for turning on the semiconductor device Q1. And the low level signal is also transferred to the input terminal "R" of the latch circuit 12A.

b) At the time T0, as the semiconductor device Q1 still remains in the off state, both the voltage $V_{ds}$ between the drain and source electrodes and the detection-signal "SENSE", transferred by the $V_{ds}$ voltage detector 4B, are at the high level. Then the high level signal is transferred to the input terminal "S" of the latch circuit 12A. Accordingly, the latch circuit 12A provides a high level signal at the output terminal "f".

c) Then, carriers are being injected into the control electrode of the semiconductor device Q1 by the control current Ig, until the semiconductor device Q1 completes the turn-on transition. At the time T1, as the turn-on transition of the semiconductor device Q1 is proceeding, the voltage $V_{ds}$ between the drain and source electrodes of the semiconductor device Q1 is decreasing to provide a detection-signal "SENSE" of a low level from the $V_{ds}$ voltage detector 4B. The detection-signal "SENSE" of the low level is transferred to the input terminal "S" of the latch circuit 12A. At the time T1, the low level signal is still provided to the input terminal "R" of the latch circuit 12A.

d) Then, the latch circuit 12A provide a low level at the output terminal "f", which is the value of the previous state before the transition at the time T1. The low level at the output terminal "f" is inverted by the NOT gate 61 to provide a high level signal. The output of the NOT gate 61 and the signal at the input terminal $V_{cont}$ are supplied to the both of the inputs of the AND gate 62. And the AND gate 62 supplies a low level signal to the nMOS transistors Q4 so that it keeps the off state. The low level signal at the input terminal $V_{cont}$ is also supplied to the nMOS transistor Q5 to keep its off state.

(Operation in Turn-Off Transition)

The turn-off transition process of the semiconductor device Q1 according to the seventh embodiment will now be explained referring to a time chart shown in FIG. 15.

a) At the time T2, the turn-off control signal of the high level is supplied from the external drive unit (not shown in FIG. 13) to the input terminal $V_{cont}$, so as to turn off the pMOS transistor Q3. Then the supply of the control current Ig to the semiconductor device Q1 is blocked by the pMOS transistor Q3 in the off state. The turn-off control signal of the high level also turns on the nMOS transistor Q5 so as to start pulling out the stored carriers from the control electrode of the semiconductor device Q1 by using the second carrier pull out path 52. Then, the turn-off transition of the semiconductor device Q1 will start.

b) At the time T2, as the semiconductor device Q1 still remains in the on state, both the voltage $V_{ds}$ between the drain and source electrodes and the detection-signal "SENSE", transferred by the $V_{ds}$ voltage detector 4B, are at the low level. Then the low level signal is transferred to the input terminal "S" of the latch circuit 12A. And the high level signal is transferred to the input terminal "R" of the latch circuit 12A. Accordingly, the latch circuit 12A provides at the output terminal "f" with a low level signal (Se the truth table shown in FIG. 14).

c) This causes the output signal $V_{mz}$ of the AND gate 62 of the logic circuit 12B to shift to the high level. Then, the nMOS transistor Q4 turns on to conduct the first carrier pull out path 51. As a result, the carriers are pulled out from the control electrode of the semiconductor device Q1 using both the first carrier pull out path 51 and the second carrier pull out path 52.

d) Then, as the turn-off transition of the semiconductor device Q1 proceeds, the voltage $V_{ds}$ between the drain and source electrodes increases, and the detection-signal "SENSE", transferred by the $V_{ds}$ voltage detector 4B, rises up to a high level exceeding a logic threshold voltage level (Vth) required at the input terminal "S" of the logic circuit 12C.

e) At the input terminal "R", the input signal of high level from the input terminal $V_{cont}$ is still supplied at the time T3. Then, at the time T3, when the detection-signal "SENSE" having the high level is supplied to the input terminal "S", the latch circuit 12A provides at its output terminal "f" a high level signal (See the truth table shown in FIG. 14).

f) The high level signal from the output terminal "f" turns the output signal $V_{m2}$ of the AND gate 62 of the logic circuit 12B to the low level. Then, the nMOS transistor Q4 turns off to cutoff the first carrier pull out path 51, and the carriers to be pulled out from the control electrode are restricted to flow into the second carrier pull out path 52. As a result, the impedance of the carrier pull out circuit between the control and source electrodes is increased, thus retarding the carrier pull out speed. With the low carrier pull out speed, the semiconductor device Q1 completes the turn-off transition at the time T4 as shown in FIG. 15.

Figure 15:
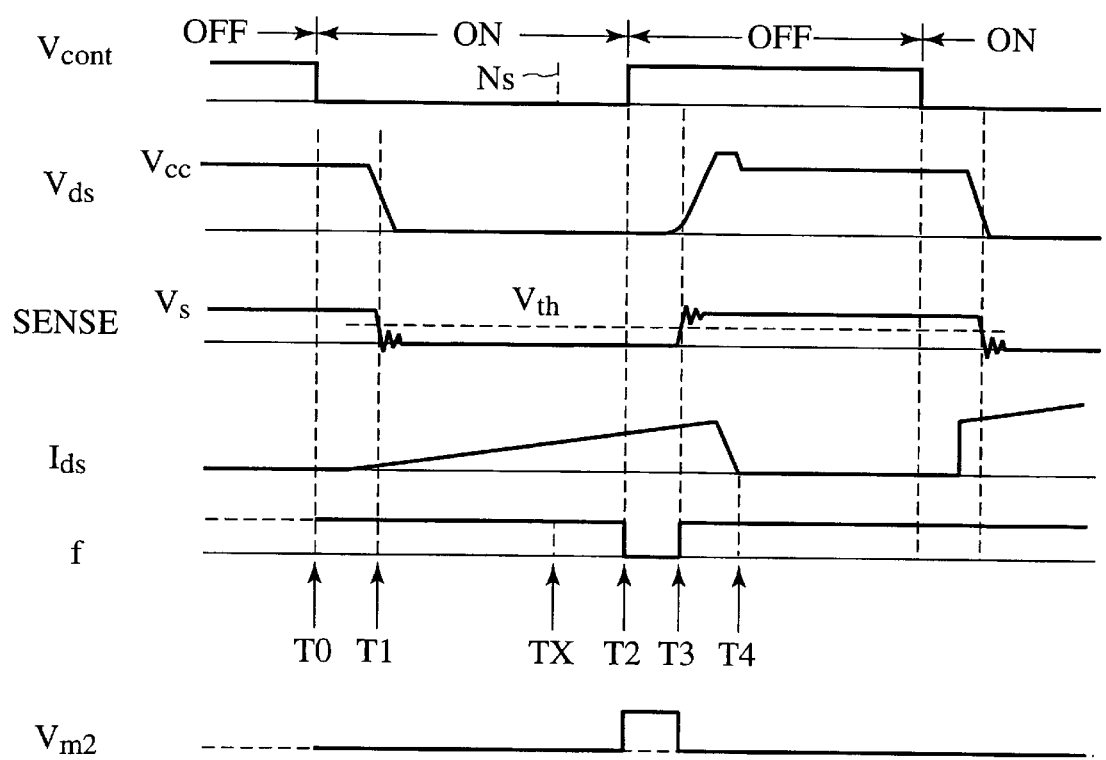
FIG. 15 is a timing chart showing signal waveforms in the drive circuit shown in FIG. 13.

The technical advantage of the seventh embodiment lies in the following aspects:

It is assumed that an impulse noise Ns denoted by the broken line in FIG. 15 is impressed on the signal received at the input terminal $V_{cont}$ during the semiconductor device Q1 is on state, or at the time Tx between T1 and T2. When the noise Ns, or impulse nigh level is received by the input terminal "R" of the logic circuit 12C, the output terminal "f" of the latch circuit 12A is reset to the low level, since the detection-signal "SENSE" of the low level is supplied to the input terminal "S" of the latch circuit 12A at the time tx (See the truth table shown in FIG. 14). Then, when the signal received at the input terminal $V_{cont}$ returns to the low level as the impulse noise Ns disappears afterwards, the latch circuit 12A latches with the value of the previous state, or the low level signal, at its output terminal "f". Accordingly, the logic level of the output signal of the output terminal "f" curing the interval between the times T0 to T2 may vary depending on the presence of the noise Ns.

However, one of the input terminal of the AND gate 62 is always supplied with the low level signal from the input terminal $V_{cont}$ during the interval between the time T0 to T2. Then, the output signal $V_{m2}$ of the AND gate 62 in the logic circuit 12B is kept to be the low level in the interval between the time T0 to T2, regardless of the logic level at the output terminal "f". And the AND gate 62 supplies the low level signal to the nMOS transistors Q4, inhibiting the nMOS transistor Q4 from being turned on. Accordingly, the nMOS transistor Q4 once turned of can be inhibited from being turned on by the impulse noise Ns impressed on the signal supplied from the input terminal $V_{cont}$. The nMOS transistor Q5 inserted in the second carrier pull out path 52, having higher impedance than the on-state resistance $r_{on}$ of the nMOS transistor Q4, may be turn on by the impulse noise Ns, but the current flowing the second carrier pull out path 52 is limited to the smaller value by the resistor $R_{52b}$. Anyhow, it is hard to allow both of the nMOS transistors Q4 and Q5 to turn on at the same time, and larger current cannot flow. Moreover, it is hard to allow all of the pMOS transistor Q3 and the nMOS transistors Q4 and Q5 to turn on simultaneously and to provide an excessive large flow of unrequired current.

Therefore, the drive circuit of the seventh embodiment is highly immune to any external noise.

(Other Embodiments)

Various modifications will become possible for those skilled in the art after receiving the teachings of the present disclosure without departing from the scope thereof.

The semiconductor device Q1 to be controlled by the drive circuit of the present invention is not limited to the current-controlled semiconductor element shown in FIGS. 1A–1D, but may successfully be employed variety of semiconductor devices such as a bipolar transistor (BJT), a bipolar mode static induction transistor (BSIT). In the case of BJT, a base electrode may serves as a control electrode of the present invention. And an emitter electrode may serves as a first main electrode, while a collector electrode serves as a second main electrode. In DMT, MOS-FCT, SI-thyristor, the gate, anode and cathode electrodes corresponds to the control, the first main and the second main electrodes, respectively. The drive circuit of the present invention is applicable to any of such semiconductor devices, of which the carrier pull out speed from the control electrodes of the devices for turning off the devices is fast enough to cause oscillations of the control signals.

Further, the circuitry for detecting the specific feature representing the completion of the turn-off transition of the semiconductor device is very close to its completion are not limited to those described in the first to seventh embodiment. Similarly, the circuitry for changing the impedance before or after the detection of the specific feature to the completion of the turn-off transition are not limited to those described in the first to seventh embodiments.

Then, it would be understood that the present invention covers other modifications of the embodiments, which are not described in the first to seventh embodiments.

This application claims benefit of priority under 35 USC 119 based on Japanese Patent Application No. P11-373485 filed on Dec. 28, 1999, and Japanese Patent Application No. P2000-273761 filed on Sep. 8, 2000, the entire contents of which are incorporated by reference herein.

What is claimed is:

1. A drive circuit for a semiconductor device having a control electrode, first and second main electrodes, comprising:
    a detector configured to detect a voltage between the first and second main electrodes so as to identify a specific feature representing a timing from which a turn-off transition of the semiconductor device approaches its completion;
    a carrier pull out circuit configured to pull out stored carriers from the control electrode; and
    a control circuit configured to maintain the impedance of the carrier pull out circuit at a first level in the initial stage of the turn-off transition and, when the detector detects the specific feature, to change the impedance of the carrier pull out circuit to a second level higher than the first level and to maintain the second level until the turn-off transition is completed.

2. The drive circuit of claim 1, wherein the carrier pull out circuit includes a parallel circuit of first and second carrier pull out paths, the parallel circuit implementing the first level of the impedance and the second carrier pull out path implementing the second level of the impedance,
    wherein the control circuit connects the first and second carrier pull out paths to the control electrode before the detector detects the specific feature and selectively disconnects the first carrier pull out path from the control electrode so that only the second carrier pull out path is connected to the control electrode when the detector detects the specific feature.

3. The drive circuit of claim 2, wherein the control circuit includes a logic circuit configured to maintain the second carrier pull out path in a blocking state when any impulse noise is impressed on a control signal for controlling the impedance of carrier pull out circuit.

4. The drive circuit of claim 2, wherein said control circuit includes a logic circuit configured to connect said first and second carrier pull out paths to said control electrode nina period before said detector detects the specific feature and to selectively disconnect said first carrier pull out path from said control electrode after a timing when said detector detects the specific feature.

5. The drive circuit of claim 4, wherein said logic circuit is a JK flip-flop having two input terminals "J" and "K" and one output terminal "f", the input terminal "K" is connected to said detector, and the output terminal "f" provides a signal for selectively disconnecting said first carrier pull out path from said control electrode when said detector detects the specific feature.

6. The drive circuit of claim 4, wherein said logic circuit comprises:
    a SR logic circuit having two input terminals "S" and "R", the input terminal "S" is connected to said detector; and
    a JK latch circuit having two input terminals "J" and "K" and one output terminal "f", the input terminals "J" and "K" are connected to two output terminals of said SR logic circuit respectively, and the output terminal "f" provides a signal for selectively disconnecting said first carrier pull out path from said control electrode when said detector detects the specific feature.

7. The drive circuit of claim 6, wherein said SR logic circuit comprises:
    a first NAND gate having two input terminals commonly connected to the input terminal "S"; and
    a second NAND gate having a first input terminal connected to an output terminal of said first NAND gate and second input terminal connected to the input terminal "R".

8. The drive circuit of claim 6, further comprising:
    a NOT gate connected to the output terminal "f" of said JK latch circuit; and
    an AND gate having an input terminal connected to said NOT gate and an output terminal providing the signal for selectively disconnecting said first carrier pull out path from said control electrode when said detector detects the specific feature.

9. The drive circuit of claim 1, wherein the carrier pull out circuit includes an impedance variable device configured to set the impedance to the first level before the detector detects the specific feature and, when the detector detects the specific feature, change to the impedance to the second level.

10. A semiconductor switching circuit comprising:
    a semiconductor device having a control electrode, first and second main electrodes;
    a detector configured to detect a voltage between the first and second main electrodes so as to identify a specific feature representing a timing from which a turn-off transition of said semiconductor device approaches its completion;
    a carrier pull out circuit configured to pull out stored carriers from the control electrode; and
    a control circuit configured to maintain the impedance of the carrier pull out circuit to a second level higher than the first level and to maintain the second level until the turn-off transition is completed.

11. The semiconductor switching circuit of claim 10, wherein the carrier pull out circuit includes a parallel circuit of first and second carrier pull out paths, the parallel circuit implementing the first level of the impedance and the second carrier pull out path implementing the second level of the impedance, wherein the control circuit connects the first and second carrier pull out paths to the control electrode before the detector detects the specific feature and selectively disconnects the first carrier pull out path from the control electrode so that only the second carrier pull out path is connected to the control electrode when the detector detects the specific feature.

12. The semiconductor switching circuit of claim 10, wherein the control circuit includes a logic circuit configured to maintain the second carrier pull out path in a blocking state when any impulse noise is impressed on a control signal for controlling the impedance of carrier pull out circuit.

13. The semiconductor switching circuit of claim 11, wherein said control circuit includes a logic circuit configured to connect said first and second carrier pull out paths to said control electrode before said detector detects the specific feature and to selectively disconnect said first carrier pull out path from said control electrode when said detector detects the specific feature.

14. The semiconductor switching circuit of claim 13, wherein said logic circuit is a JK flip-flop having two input terminals "J" and "K" and one output terminal "f", the input terminal "K" is connected to said detector, and the output terminal "f" provides a signal for selectively disconnecting said first carrier pull out path from said control electrode when said detector detects the specific feature.

15. The semiconductor switching circuit of claim 13, wherein said logic circuit comprises:

a SR logic circuit having two input terminals "S" and "R", the input terminal "S" is connected to said detector; and A JK latch circuit having two input terminals "J" and "K" and one output terminal "f", the input terminals "J" and "K" are connected to two output terminals of said SR logic circuit respectively, and the output terminal "f" provides a signal for selectively disconnecting said first carrier pull out path from said control electrode when said detector detects the specific feature.

16. The semiconductor switching circuit of claim 15, wherein said SR logic circuit comprises:

a first NAND gate having two input terminals commonly connected to the input terminal "S"; and a second NAND gate having a first input terminal connected to an output terminal of said first NAND gate and second input terminal connected to the input terminal "R".

17. The semiconductor switching circuit of claim 15, further comprising:

a NOT gate connected to the output terminal "f" of said JK latch circuit; and an AND gate having an input terminal connected to said NOT gate and an output terminal providing the signal for selectively disconnecting said first carrier pull out path from said control electrode when said detector detects the specific feature.

18. The semiconductor switching circuit of claim 10, wherein the carrier pull out circuit includes an impedance variable device configured to set the impedance to the first level before the detector detects the specific feature and, when the detector detects the specific feature, change to the impedance to the second level.

19. The semiconductor switching circuit of claim 10, wherein said semiconductor device comprises:

a substrate region of a first conductivity type;

a drain region of the first conductivity type disposed on the substrate region;

a source region of the first conductivity type disposed in and at a portion of a top surface of said drain region;

an injector region of a second conductivity type disposed in and at another portion of the top surface of said drain region;

an insulating film disposed on bottom and side walls of a groove cut at the top surface of said drain region, the groove penetrating said source region from the top surface to towards an interior of said drain region;

a source electrode forming an ohmic contact with said source region; the source electrode serving as said first main electrode;

a drain electrode forming the ohmic contact with said substrate region; the drain electrode serving as said second main electrode; and an injection electrode forming the ohmic contact with said injector region; the injection electrode serving as said control electrode.

20. A drive circuit for a semiconductor device having a control electrode, first and second main electrodes, comprising;

a detecting means for detecting a voltage between the first and second main electrodes so as to identify a specific feature representing a timing from which a turn-off transition of the semiconductor device approaches its completion;

a carrier pull out means for pulling out stored carriers from the control electrode; and a control means for maintaining the impedance of the carrier pull out means at a first level in the initial stage of the turn-off transition and, when the detecting means detects the specific feature, for changing the impedance of the carrier pull out means to a second level higher than the first level and maintaining the second level until the turn-off transition is completed.

21. A semiconductor switching circuit comprising:

a semiconductor device having a control electrode, first and second main electrodes;

a detecting means for detecting a voltage between the first and second main electrodes so as to identify a specific feature representing a timing from which a turn-off transition of said semiconductor device approaches its completion;

a carrier pull out means for pulling out stored carriers from the control electrode; and a control means for maintaining the impedance of the carrier pull out means at a first level in the initial stage of the turn-off transition and, when the detection means detects the specific feature, for changing the impedance of the carrier pull out means to a second level higher than the first level and maintaining the second level until the turn-off transition is completed.

* * * * *